(12) United States Patent
Kasai et al.

(10) Patent No.: US 8,143,140 B2
(45) Date of Patent: Mar. 27, 2012

(54) SUBSTRATE HAVING THIN FILM OF GAN JOINED THEREON AND METHOD OF FABRICATING THE SAME, AND A GAN-BASED SEMICONDUCTOR DEVICE AND METHOD OF FABRICATING THE SAME

(75) Inventors: Hitoshi Kasai, Itami (JP); Akihiro Hachigo, Itami (JP); Yoshiki Miura, Itami (JP); Katsushi Akita, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/765,357

(22) Filed: Apr. 22, 2010

(65) Prior Publication Data

US 2010/0210089 A1    Aug. 19, 2010

Related U.S. Application Data

(62) Division of application No. 11/819,574, filed on Jun. 28, 2007, now Pat. No. 7,728,348.

(30) Foreign Application Priority Data

Jun. 30, 2006 (JP) ................................. 2006-182118

(51) Int. Cl.
H01L 21/30 (2006.01)
H01L 21/46 (2006.01)

(52) U.S. Cl. ................. 438/458; 257/E21.568

(58) Field of Classification Search ........... 438/458; 257/E21.568, E21.57
See application file for complete search history.

(56) References Cited

U.S. PATENT DOCUMENTS 6,606,335 B1    8/2003    Kuramata et al.
(Continued)

FOREIGN PATENT DOCUMENTS

EP    0 966 047 A    12/1999
(Continued)

OTHER PUBLICATIONS

European Search Report issued in European Patent Application No. EP 07 01 1175.2 dated Aug. 21, 2009.
(Continued)

*Primary Examiner* — Matthew Landau
*Assistant Examiner* — Daniel Luke
(74) *Attorney, Agent, or Firm* — McDermott Will & Emery LLP

(57) ABSTRACT

There is provided a method of producing a thin GaN film-joined substrate, including the steps of: joining on a GaN bulk crystalline body a substrate different in type or chemical composition from GaN; and dividing the GaN bulk crystalline body at a plane having a distance of at least 0.1 μm and at most 100 μm from an interface thereof with the substrate different in type, to provide a thin film of GaN on the substrate different in type, wherein the GaN bulk crystalline body had a surface joined to the substrate different in type, that has a maximum surface roughness Rmax of at most 20 μm. Thus a GaN-based semiconductor device including a thin GaN film-joined substrate including a substrate different in type and a thin film of GaN joined firmly on the substrate different in type, and at least one GaN-based semiconductor layer deposited on the thin film of GaN, can be fabricated at low cost.

5 Claims, 8 Drawing Sheets

U.S. PATENT DOCUMENTS

| | | | |
|---|---|---|---|
| 2003/0064535 A1 | 4/2003 | Kub et al. | |
| 2003/0153163 A1 | 8/2003 | Letertre et al. | |
| 2004/0033638 A1 | 2/2004 | Bader et al. | |
| 2004/0089919 A1 | 5/2004 | Motoki et al. | |
| 2004/0137657 A1 | 7/2004 | Dmitriev et al. | |
| 2005/0066880 A1* | 3/2005 | Furukawa et al. | 117/2 |
| 2005/0104162 A1 | 5/2005 | Xu et al. | |
| 2006/0035440 A1* | 2/2006 | Ghyselen et al. | 438/458 |
| 2006/0081868 A1* | 4/2006 | Kotani | 257/99 |
| 2006/0194360 A1* | 8/2006 | Takeuchi et al. | 438/46 |

FOREIGN PATENT DOCUMENTS

| | | |
|---|---|---|
| EP | 1 111 663 A | 6/2001 |
| EP | 1 528 591 A | 5/2005 |
| EP | 1 667 223 A | 6/2006 |
| JP | 10-229218 | 8/1998 |
| JP | 2002-329665 | 11/2002 |
| JP | 2003-165799 | 6/2003 |
| JP | 2004-512688 | 4/2004 |
| JP | 2005-252244 | 9/2005 |
| JP | 2005-340308 | 12/2005 |
| JP | 2006-140445 | 6/2006 |
| WO | WO 2005/004231 | 1/2005 |

OTHER PUBLICATIONS

Japanese Notice of Grounds of Rejection issued in Japanese Patent Application No. 2006-182118 dated Jan. 10, 2012.

* cited by examiner

SUBSTRATE HAVING THIN FILM OF GAN JOINED THEREON AND METHOD OF FABRICATING THE SAME, AND A GAN-BASED SEMICONDUCTOR DEVICE AND METHOD OF FABRICATING THE SAME

RELATED APPLICATIONS

This application is a Divisional of U.S. patent application Ser. No. 11/819,574, filed on Jun. 28, 2007 now U.S. Pat. No. 7,728,348, claiming priority of Japanese Patent Application No. 2006-182118, filed on Jun. 30, 2006, the entire contents of each of which are hereby incorporated by reference.

BACKGROUND OF THE INVENTION

1. Field of the Invention

The present invention relates to thin GaN film-joined substrates formed of a substrate different in type, or chemical composition, from GaN, and a thin film of GaN joined on the substrate different in type, and methods of producing the same. Furthermore the present invention relates to GaN-based semiconductor devices including at least one GaN-based semiconductor layer deposited on the thin film of GaN and methods of fabricating the same.

2. Description of the Background Art

A GaN substrate is suitably used as well as GaAs, InP and other similar substrates for semiconductor devices. The GaN substrate, however, requires an extremely higher fabrication cost than GaAs and InP substrates. Accordingly semiconductor devices utilizing a GaN substrate require an extremely high fabrication cost. This derives from a difference between the method of producing a GaN substrate and those of producing GaAs and InP substrates.

More specifically, for GaAs and InP substrates, Bridgman crystal growth, Czochralski crystal growth or similar liquid phase deposition is employed to grow a crystal. As such, the crystal can be grown fast. For example, at least 200 mm thick, large GaAs and InP bulk crystalline bodies can be readily grown in a period of approximately 100 hours, and such thick, large bulk crystalline bodies allow approximately 200 μm to 400 μm thick, free standing GaAs and InP substrates to be cut out therefrom in large amounts, respectively, (e.g., at least 100 substrates for each type of substrate).

For a GaN substrate, in contrast, hydride vapor phase epitaxy (HVPE), metalorganic chemical vapour deposition (MOCVD) or other similar vapor phase deposition is employed to grow a crystal. As such, the crystal is grown slowly. For example, a crystal growth period of approximately 100 hours can only provide an approximately 10 mm thick GaN bulk crystalline body, and such bulk crystalline body only allows a small amount of (e.g., approximately 10) approximately 200 μm to 400 μm thick, free standing GaN substrates to be cut out therefrom.

If the GaN film to be cut out from the GaN bulk crystalline body is reduced in thickness to provide an increased number of GaN substrates, however, the film is reduced in strength and cannot be a free standing substrate. Thus there is a need for a method reinforcing the thin film of GaN cut out from the GaN bulk crystalline body.

One such method reinforcing the thin film of GaN is to produce a thin GaN film-joined substrate formed of a substrate different in type, or chemical composition, from GaN, and a thin film of GaN joined on the substrate different in type (hereinafter also referred to as a "film-joined substrate"). Such film-joined substrates are produced in methods disclosed for example in Japanese Patent National Publication No. 2004-512688 and Japanese Patent Laying-open No. 2005-252244. If film-joined substrates produced in the methods described in the publications are used to fabricate semiconductor devices by MOCVD, MBE or similar vapor deposition, however, the thin film of GaN deposited on the substrate different in type disadvantageously peels off the substrate in the step of depositing a semiconductor layer on the thin film of GaN.

SUMMARY OF THE INVENTION

The present invention contemplates a thin GaN film-joined substrate formed of a substrate different in type, or chemical composition, from GaN and a thin film of GaN firmly joined on the substrate different in type, and a method of producing the same, and a GaN-based semiconductor device including at least one GaN-based semiconductor layer deposited on the thin film of GaN and a method of fabricating the same.

The present invention provides a method of producing a thin GaN film-joined substrate, including the steps of: joining on a GaN bulk crystalline body a substrate different in type, different in chemical composition from GaN; and dividing the GaN bulk crystalline body at a plane having a distance of at least 0.1 μm and at most 100 μm from an interface thereof with the substrate different in type, to provide a thin film of GaN on the substrate different in type, wherein the GaN bulk crystalline body had a surface joined on the substrate different in type, that has a maximum surface roughness Rmax of at most 20 μm.

The present method of producing the thin GaN film-joined substrate can further include the step of implanting a type of ions selected from the group consisting of hydrogen ions, helium ions and nitrogen ions into the GaN bulk crystalline body at a plane located at a depth of at least 0.1 μm and at most 100 μm from the surface of the GaN bulk crystalline body that is to be joined before the step of joining the substrate different in type on the GaN bulk crystalline body, wherein the step of dividing the GaN bulk crystalline body can include subjecting the GaN bulk crystalline body to a heat treatment. Furthermore, the step of dividing the GaN bulk crystalline body can include cutting the GaN bulk crystalline body at the plane having the distance of at least 0.1 μm and at most 100 μm from the interface thereof with the substrate different in type.

Furthermore the present invention provides a method of fabricating a first GaN-based semiconductor device with a thin GaN film-joined substrate obtained in the aforementioned method, including the step of growing at least one GaN-based semiconductor layer on the thin film of GaN of the thin GaN film-joined substrate.

Furthermore the present invention provides a method of fabricating a second GaN-based semiconductor device utilizing the first GaN-based semiconductor device obtained in the aforementioned method, including the steps of: joining a radiating and electrically conductive substrate on an outermost layer of the GaN-based semiconductor layer of the first GaN-based semiconductor device; and separating the thin film of GaN and the substrate different in type from each other.

Furthermore the present invention provides a thin GaN film joined substrate including: a substrate different in type, different in chemical composition from GaN; and a thin film of GaN having a thickness of at least 0.1 μm and at most 100 μm and joined on the substrate different in type.

In the present thin GaN film-joined substrate, the thin film of GaN can have a dislocation density of at most $1 \times 10^9$ cm$^{-2}$. Furthermore the thin film of GaN can have a carrier density of at least $1 \times 10^{17}$ cm$^{-3}$. Furthermore the thin film of GaN can include a first crystalline region of a single crystal and a second crystalline region including at least one of a portion formed of a single crystal having a [0001] direction inverted relative to the first crystalline region and a polycrystalline portion. Furthermore the substrate different in type can have a coefficient of thermal expansion of at least $1\times10^{-8}$ $K^{-1}$ and at most $1\times10^{-5}$ $K^{-1}$.

Furthermore the present invention provides a first GaN-based semiconductor device comprising: a substrate different in type, different in chemical composition from GaN; a thin film of GaN having a thickness of at least 0.1 μm and at most 100 μm and joined on the substrate different in type; and at least one GaN-based semiconductor layer deposited on the thin film of GaN.

Furthermore the present invention provides a second GaN-based semiconductor device comprising: a thin film of GaN having a thickness of at least 0.1 μm and at most 100 μm; at least one GaN-based semiconductor layer deposited on the thin film of GaN; and a radiating and electrically conductive substrate joined on an outermost layer of the GaN-based semiconductor layer.

The present invention can thus provide a thin GaN film-joined substrate formed of a substrate different in type, or chemical composition, from GaN and a thin film of GaN firmly joined on the substrate different in type and a method of producing the same, and a GaN-based semiconductor device including at least one GaN-based semiconductor layer deposited on the thin film of GaN and a method of fabricating the same. This allows a semiconductor device to be fabricated at reduced cost.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1(a)-1(g) illustrate the steps of: growing a GaN bulk crystalline body; providing mirror surface; joining a substrate different in type; dividing the GaN bulk crystalline body; growing a GaN-based semiconductor layer; joining a radiating and electrically conductive plate; and separating the substrate different in type, respectively.

FIGS. 2(a)-2(d) illustrate the steps of: implanting ions; cleaning a surface; joining a substrate different in type; and subjecting a GaN bulk crystalline body to a heat treatment to divide the GaN bulk crystalline body.

FIGS. 3(a)-3(c) illustrate the steps of: cleaning a surface; joining a substrate different in type; and cutting a GaN bulk crystalline body to divide it.

FIGS. 7(a)-7(e) illustrate the steps of: providing a mirror surface; implanting ions; cleaning a surface; joining a substrate different in type; and subjecting a GaN bulk crystalline body to a heat treatment to divide the GaN bulk crystalline body.

FIGS. 10(a)-10(c) illustrate the steps of: providing at least one GaN-based semiconductor layer on a thin GaN film-joined substrate; joining a radiating and electrically conductive plate; and separating a substrate different in type, respectively.

DESCRIPTION OF THE PREFERRED EMBODIMENTS

Embodiment 1

The present, thin GaN film joined substrate in one embodiment includes a substrate 20 different in type, or chemical composition, from GaN, and a thin film of GaN 10a having a thickness of at least 0.1 μm and at most 100 μm and joined on substrate 20 different in type, as shown in FIG. 1(d). The present embodiment provides a thin GaN film-joined substrate 1 having joined on the substrate 20 different in type the thin film of GaN 10a having the thickness of at least 0.1 μm and at most 100 μm. This allows a large number of thin GaN film joined substrates to be obtained from a GaN bulk crystalline body, and substrates for semiconductor devices and the semiconductor devices to be produced at reduced costs.

Figure 1:
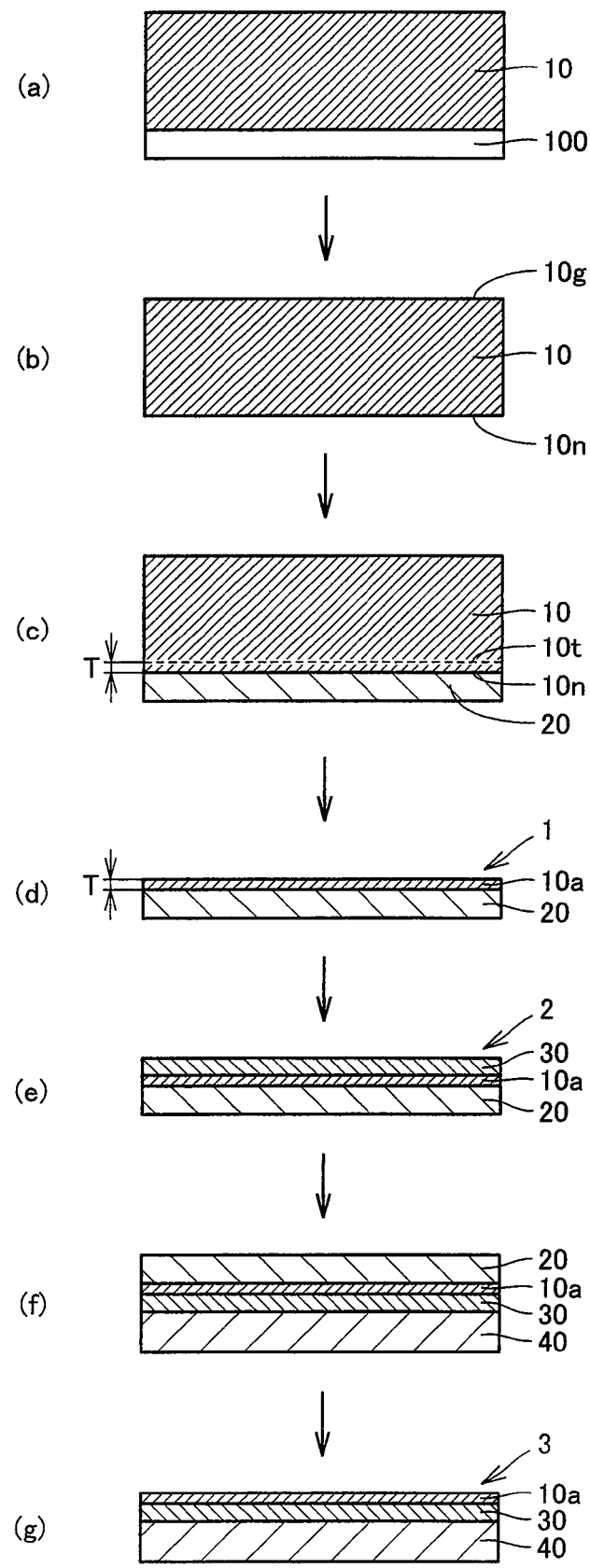
FIGS. 1(a)-1(g) illustrate a thin GaN film-joined substrate, first and second GaN-based semiconductor devices, and methods of producing and fabricating the substrate and the semiconductor devices, respectively. More specifically.

With reference to FIG. 1, the present thin GaN film-joined substrate is produced in a method, as provided in one embodiment, including the steps of joining substrate 20 different in type, or chemical composition, from GaN on a GaN bulk crystalline body 10, (FIG. 1(c)), and dividing GaN bulk crystalline body 10 at a plane 10t, which has a distance of at least 0.1 μm and at most 100 μm from an interface thereof with substrate 20 different in type, to provide thin film of GaN 10a on substrate 20 different in type (FIG. 1(d)). Such method can provide thin film of GaN 10a that is joined on substrate 20 different in type and has the thickness of at least 0.1 µm and at most 100 µm.

More specifically, with reference to FIG. 1(a), GaN bulk crystalline body 10 is grown by HVPE or similar vapor deposition using an underlying substrate 100 implemented by a GaAs, sapphire, SiC or similar substrate that can be good lattice matching with GaN crystal. From GaN bulk crystalline body 10 thus grown, underlying substrate 100 is ground or similarly removed by a well known technique to obtain GaN bulk crystalline body 10 as shown in FIG. 1(b). GaN bulk crystalline body 10 has a nitrogen atom surface (hereinafter also simply referred to as an "N surface") 10n polished to be a mirror surface. Note that GaN bulk crystalline body 10 has a gallium atom surface (hereinafter also simply referred to as a "Ga surface") 10g opposite to N surface 10n.

Then with reference to FIG. 1(c) substrate 20 different in type is joined on N surface 10n of GaN bulk crystalline body 10. This can be done in any manner, although preferably by surface activation, fusion bonding or the like, since such techniques allow the substrate to be uniformly joined at low temperature. Note that surface activation exposes a surface to be joined to a plasma to activate the surface and subsequently join it. Fusion bonding is a technique pressurizing and thus heating cleaned surfaces (surfaces to be joined together) to join the surfaces together.

In the present embodiment the GaN bulk crystalline body has a surface to be joined (on a substrate different in type), which has a maximum surface roughness Rmax of at most 20 µm. Maximum surface roughness Rmax indicates a maximum value of a difference in level between a crest and a trough of the entirety of the surface to be joined. The surface to be joined may be provided with maximum surface roughness Rmax of at most 20 µm by any method. For example one such method includes the step of joining on a GaN bulk crystalline body a substrate different in type or chemical composition from GaN after the step of polishing that surface of the GaN bulk crystalline body which is to be joined, to have maximum surface roughness Rmax of at most 20 µm. If the GaN bulk crystalline body has a surface to be joined that has maximum surface roughness Rmax exceeding 20 µm, and temperature is increased to approximately 1,200° C., which allows a GaN-based semiconductor layer to be epitaxially grown, and is subsequently decreased, the thin film of GaN is prone to peeling off. Accordingly the surface to be joined has maximum surface roughness Rmax more preferably of at most 10 µm. Maximum surface roughness Rmax can be measured with a flatness tester and a contact-type surface profiler.

Furthermore, to join the thin film of GaN and the substrate different in type together more strongly and further reduce the peeling of the thin film of GaN off the substrate different in type, the GaN bulk crystalline body preferably has the surface to be joined that has an average surface roughness Ra of at most 1 nm. Herein average surface roughness Ra indicates a value obtained by extracting only a reference area from a surface roughness profile in the direction of its average surface and averaging, for the reference area, absolute values each representing the distance from the average surface of the extracted portion to a surface profile measured. Average surface roughness Ra can be measured with an optical interference surface profiler or the like. That surface of the GaN bulk crystalline body which is to be joined may be provided with average surface roughness Ra of at most 1 nm in any method. For example, one such method includes the steps of: polishing the surface to be joined, and subsequently etching the polished surface with chlorine gas to provide the surface with average surface roughness Ra of at most 1 nm before the step of joining on the surface a substrate different in type.

The step of joining substrate 20 different in type on GaN bulk crystalline body 10 is preferably preceded by the step of etching that surface of GaN bulk crystalline body 10 which is to be joined. Such etching can remove oxide film formed on a surface of GaN bulk crystalline body 10 and enhance the surface in flatness, allowing the GaN bulk crystalline body and the substrate different in type to be joined more strongly. While such etching is not limited to any particular manner, it is done more preferably with chlorine gas than argon gas as the former allows GaN bulk crystalline body 10 to have a surface having more of the oxide film removed therefrom, and enhanced in flatness.

If argon gas is used to etch that surface of the GaN bulk crystalline body which is to be joined, the surface is provided with average surface roughness Ra larger than 1 nm, and if such GaN bulk crystalline body with a substrate different in type joined thereon is increased in temperature to 1,200° C., which allows epitaxial growth, and is subsequently decreased in temperature, the GaN bulk crystalline body can have its joined surface peeled off the substrate. In contrast, that surface of the GaN bulk crystalline body which is to be joined, that is etched with chlorine gas can have average surface roughness Ra of at most 1 nm, and if such GaN bulk crystalline body with a substrate different in type joined thereon is increased in temperature to 1,200° C., which allows epitaxial growth, and is subsequently decreased in temperature, the GaN bulk crystalline body hardly has its joined surface peeled off the substrate.

That surface of the GaN bulk crystalline body which is to be joined has an off-angle, i.e., an angle formed by the surface to be joined and a (0001) plane, preferably of at least 0.03° and at most 20° to join the GaN bulk crystalline body and the substrate different in type together more strongly. This is probably because a surface having the off-angle of at least 0.03° and at most 20° has a larger number of bonds than a surface having an off-angle of or close to 0°, and can thus be joined to the substrate different in type more strongly. As such, that surface of the GaN bulk crystalline body which is to be joined has an off-angle more preferably of at least 0.1° and at most 2°, still more preferably at least 0.2° and at most 0.9°. Note that the off-angle of that surface of the GaN bulk crystalline body which is to be joined refers to a value of a center of that surface of the GaN bulk crystalline body which is to be joined, as measured by x ray diffraction.

Then, with reference to FIGS. 1(c) and 1(d), GaN bulk crystalline body 10 is divided at plane 10t having a distance T of at least 0.1 µm and at most 100 µm from an interface thereof with substrate 20 different in type to provide thin film of GaN 10a on substrate 20 different in type to provide thin GaN film-joined substrate 1 including substrate 20 different in type or chemical composition from GaN and thin film of GaN 10a that is joined on substrate 20 different in type and has a thickness T of at least 0.1 µm and at most 100 µm. Note that in FIG. 1 substrate 20 different in type is shown as an electrically conductive substrate, it may be an insulating substrate.

In embodiment 1 a GaN bulk crystalline body is divided at a plane having a distance of at least 0.1 µm and at most 100 µm from an interface thereof with a substrate different in type, as will be described hereinafter. Hereinafter as an embodiment 1A will be described an example of a production method preferable for dividing at a plane having a smaller distance from the interface with the substrate different in type and as an embodiment 1B will be described an example of a production method preferable for dividing at a plane having a larger distance from the interface with the substrate different in type.

Embodiment 1A

Figure 2:
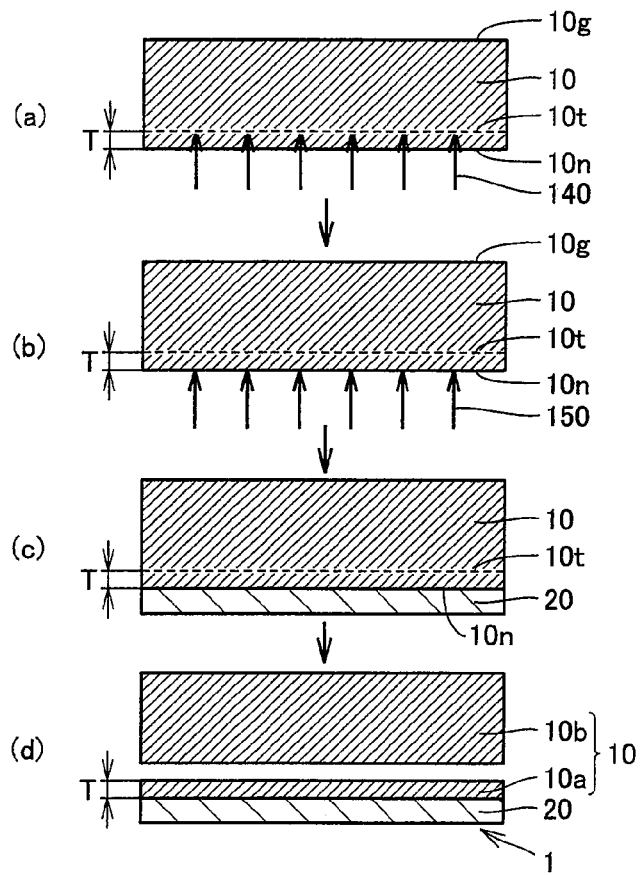
FIGS. 2(a)-2(d) are cross sections for schematically illustrating one example of a method of producing a thin GaN film-joined substrate in accordance with the present invention. More specifically.

Embodiment 1A is applied to dividing at a plane having a distance of at least 0.1 μm and at most 100 μm, preferably at least 0.1 μm and at most 50 μm, more preferably at least 0.1 μm and at most 10 μm from the interface with the substrate different in type. The present embodiment provides a thin GaN film-joined substrate produced in a method, as follows. With reference to FIG. 2, the method includes the step of joining substrate 20 different in type on GaN bulk crystalline body 10 (FIG. 2(c)) after the step of implanting a type of ions 140 selected from the group consisting of hydrogen ions, helium ions and nitrogen ions into GaN bulk crystalline body 10 at plane 10t located at a depth T of at least 0.1 μm and at most 100 μm from that surface of GaN bulk crystalline body 10 which is to be joined (FIG. 2(a)), and includes the step of dividing GaN bulk crystalline body 10 (FIG. 2(d)) by subjecting GaN bulk crystalline body 10 to a heat treatment. Such method ensures facilitating dividing a GaN bulk crystalline body precisely at a plane having a smaller distance from an interface thereof with a substrate different in type.

More specifically, initially with reference to FIG. 2(a), a type of ions 140 selected from the group consisting of hydrogen ions, helium ions and nitrogen ions are implanted into GaN bulk crystalline body 10 having N surface 10n, which serves as a surface to be joined, mirror finished. Note that more specifically the ions are implanted at plane 10t having a distance T of at least 0.1 μm and at most 100 μm from N surface 10n. The ions may be implanted in any manner. Preferably, ion implantation equipment is employed.

Then with reference to FIG. 2(b) GaN bulk crystalline body 10 has the surface to be joined, i.e., N surface 10n, etched 150 for example with chlorine gas to be a clean surface. Furthermore a substrate different in type also has a surface to be joined (to the GaN bulk crystalline body) etched 150 for example with argon gas to be a clean surface (not shown). The surfaces to be joined together that have been cleaned allow the GaN bulk crystalline body and the substrate different in type to be joined together more firmly. Then with reference to FIG. 2(c) that surface of the GaN bulk crystalline body which is to be joined, i.e., the N surface, and that surface of the substrate different in type which is to be joined are joined together by surface activation.

Then with reference to FIG. 2(d) GaN bulk crystalline body 10 with substrate 20 different in type joined thereon is subjected to a heat treatment to embrittle the portion having a type of ions selected from hydrogen ions, helium ions and nitrogen ions implanted therein. The GaN bulk crystalline body is thus divided at that portion. Thus there is obtained thin GaN film-joined substrate 1 including substrate 20 different in type and thin film of GaN 10a joined on substrate 20 different in type. Note that the heat treatment is performed preferably at a temperature of at least 300° and at most 600°, more preferably at least 400° and at most 500° to enlarge a microcavity attributed to implanting a type of ions selected from hydrogen ions, helium ions and nitrogen ions and also reduce diffusion of the ions per se.

After thin film of GaN 10a is divided from GaN bulk crystalline body 10, a GaN bulk crystalline body 10b remains, which is, as described above, subjected to further implantation of a type of ions selected from the group consisting of hydrogen ions, helium ions and nitrogen ions. Note that ions are implanted at a plane located at at least 0.1 μm and at most 100 μm from an N surface to be subsequently joined. The N surface (that surface of the GaN bulk crystalline body which is to be joined) is then etched to be a clean surface, and then joined to a substrate different in type having a surface to be joined etched to be a clean surface. Subsequently the intermediate product is subjected to a heat treatment to provide another thin GaN film-joined substrate. Such process can be repeated to produce a large number of thin GaN film-joined substrates from a GaN bulk crystalline body.

Embodiment 1B

Figure 3:
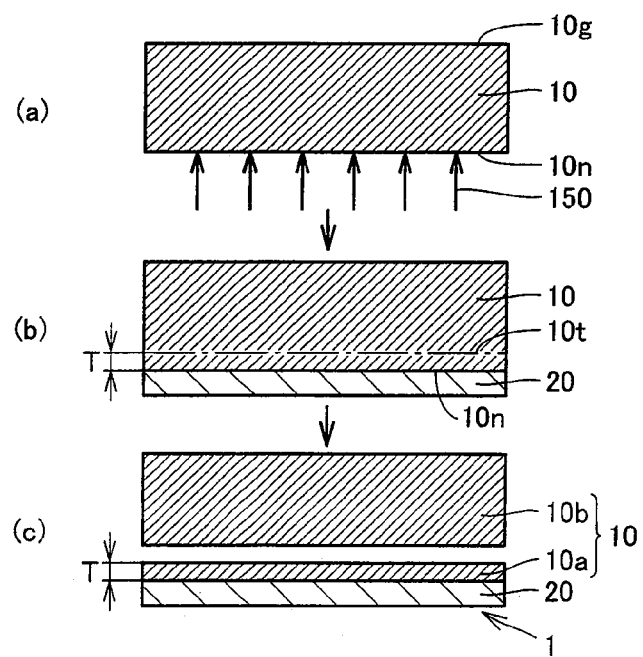
FIGS. 3(a)-3(c) are cross sections for schematically illustrating another example of the method of producing the thin GaN film-joined substrate in accordance with the present invention. More specifically.

The present embodiment is applied to dividing at a plane having a distance of at least 0.1 μm and at most 100 μm, preferably at least 10 μm and at most 100 μm, more preferably at least 50 μm and at most 100 μm from the interface with the substrate different in type. The present embodiment provides a thin GaN film-joined substrate produced in a method, as follows. With reference to FIG. 3, the method does not include the step of implanting a type of ions selected from the group consisting of hydrogen ions, helium ions and nitrogen ions into a GaN bulk crystalline body, and includes the steps of: etching 150 that surface of GaN bulk crystalline body 10 which is to be joined, i.e., N surface 10n, to be a clean source (FIG. 3(a)); joining substrate 20 different in type to GaN bulk crystalline body 10 (FIG. 3(b)); and dividing GaN bulk crystalline body 10 (FIG. 3(c)). The step of dividing GaN bulk crystalline body 10 (FIG. 3(c)) is done by cutting GaN bulk crystalline body 10 at plane 10t having distance T of at least 0.1 μm and at most 100 μm from an interface thereof with the substrate different in type. Such method ensures facilitating dividing a GaN bulk crystalline body precisely at a plane having a larger distance from an interface thereof with a substrate different in type. Thus there is obtained thin GaN film-joined substrate 1 including substrate 20 different in type and thin film of GaN 10a joined on substrate 20 different in type.

After thin film of GaN 10a is divided from GaN bulk crystalline body 10, GaN bulk crystalline body 10b remains, which, as described above, has an N surface to be subsequently joined etched to be a clean surface. GaN bulk crystalline body 10b is then joined to a substrate different in type having a surface to be joined etched to be a clean surface. Subsequently the GaN bulk crystalline body is cut at a plane having a distance of at least 0.1 μm and at most 100 μm from an interface thereof with the substrate different in type to provide another thin GaN film-joined substrate. Such process can be repeated to produce a large number of thin GaN film-joined substrates from a GaN bulk crystalline body. While the GaN bulk crystalline body may be cut in any manner, equipment generally employed to cut a group III nitride crystal for example includes an electro-discharge machine, a wire saw, an outer peripheral edge, an inner peripheral edge, laser radiation and the like to cut the crystal.

The above described method ensures that thin GaN film joined substrate 1 including substrate 20 different in type or chemical composition from GaN and thin film of GaN 10a that is joined on substrate 20 different in type and has thickness T of at least 0.1 μm and at most 100 μm can be readily produced with high precision in a large amount at reduced cost.

In embodiment 1 the thin GaN film-joined substrate preferably has a thin film of GaN having a dislocation density of at most $1 \times 10^9$ cm$^{-2}$ as the thin film of GaN having such low dislocation density improves light emitting diodes (LED), laser diode (LD) and the like optical devices in characteristics (such as optical output, longevity, and the like), and high electron mobility transistors (HEMT), vertical capacitors and the like electronic devices in characteristics (such as withstand voltage and the like). The thin film of GaN having the low dislocation density of at most $1 \times 10^9$ cm$^{-2}$ can be obtained by dividing a GaN bulk crystalline body having a low dislocation density of at most at most $1 \times 10^9$ cm$^{-2}$. In such view, the thin film of GaN has a dislocation density more preferably of at most $1 \times 10^7$ cm$^{-2}$, still more preferably at most $3 \times 10^6$ cm$^{-2}$.

Figure 4A:
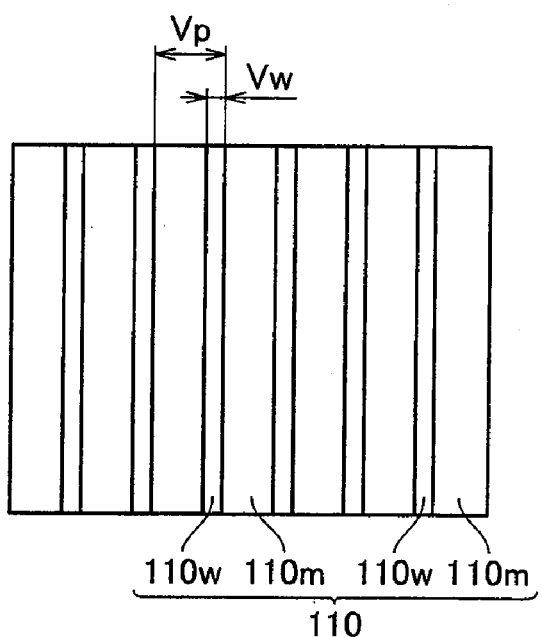
FIGS. 4A and 4B schematically show patterns of stripes and dots, respectively, for an opening in a first mask employed to grow a GaN bulk crystalline body employed in the present invention.
Figure 4B:
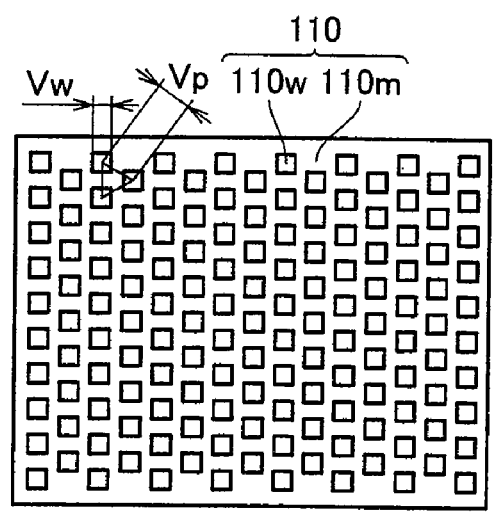

The GaN bulk crystalline body having the low dislocation density of at most $1 \times 10^9$ cm$^{-2}$ can be produced for example in a method described hereinafter with reference to FIGS. 4A and 4B. More specifically, initially a first mask layer 110 is provided on an underlying substrate. First mask layer 110 is formed of a striped patterned opening 110w and a masking portion 110m, as shown in FIG. 4A, or a dotted patterned opening 110w and masking portion 110m, as shown in FIG. 4B.

Then on such first mask layer 110 a GaN bulk crystalline body is grown to obtain a low dislocation density GaN bulk crystalline body. To obtain the dislocation density of at most $1 \times 10^9$ cm$^{-2}$, opening 110w in the form of a stripe preferably has a width Vw of 0.4 µm to 10 µm and a pitch Vp of 0.4 µm to 20 µm (FIG. 4A) and opening 110w in the form of a dot preferably has width Vw of 0.4 µm to 10 µm and pitch Vp of 2 µm to 10 µm (FIG. 4B). First mask layer 100 may be formed of any material. Preferably, it is formed of SiO$_2$, Si$_3$N$_4$, or the like.

If the thin GaN film joined substrate of embodiment 1 is used as a substrate of an LED, an LD, a vertical transistor or a similar vertical semiconductor device, preferably the thin film of GaN is electrically conductive. For example, the thin film of GaN preferably has a carrier density of at least $1 \times 10^{17}$ cm$^{-3}$. The electrically conductive thin film of GaN having the carrier density of at least $1 \times 10^{17}$ cm$^{-3}$ can be obtained by dividing a GaN bulk crystalline body having a carrier density of at least $1 \times 10^{17}$ cm$^{-3}$, and such GaN bulk crystalline body can be obtained by growing it while doping it with oxygen (O), germanium (Ge), sulfur (S), silicon (Si) or a similar dopant. For enhanced electrical conduction, a carrier density of at least $1 \times 10^{18}$ cm$^{-3}$ is preferable. Note that the carrier density of the thin film of GaN can be measured with hole measurement equipment.

The thin GaN film-joined substrate of embodiment 1 preferably includes a thin film of GaN including a first crystalline region of a single crystal and a second crystalline region including at least one of a portion formed of a single crystal having a [0001] direction inverted relative to the first crystalline region and a polycrystalline portion to reduce dislocation. Such second crystalline region can absorb and hence reduce dislocation. The thin film of GaN including the first and second crystalline regions as described above can be obtained by dividing a GaN bulk crystalline body including such first and second crystalline regions.

The GaN bulk crystalline body including the first crystalline region of a single crystal and the second crystalline region including at least one of a portion formed of a single crystal having the [0001] direction inverted relative to the first crystalline region and a polycrystalline portion can be produced for example in a method as described hereinafter with reference to FIGS. 5A and 5B, and 6A-6C. More specifically, a mask layer 130 formed of first mask layer 110 and a striped patterned second mask layer 120 (FIG. 5A) or mask layer 130 formed of first mask layer 110 and a dotted patterned second mask layer 120 (FIG. 5B) is provided on an underlying substrate. Note that herein first mask layer 110 indicates a mask layer having opening 110w in the form of a stripe or a dot, as has been described previously. Second mask layer 120 does not have an opening. Second mask layer 120 may be formed of any material. Preferably, it is formed of SiO$_2$, Si$_3$N$_4$, or the like.

Figure 6A:
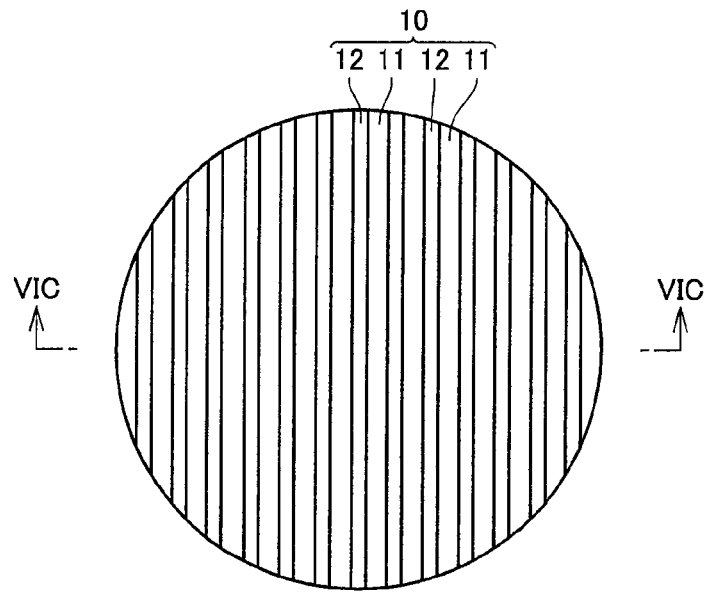
FIG. 6A is a schematic plan view of a GaN bulk crystalline body including a first crystalline region and a second, striped crystalline region, and a method of producing the same, as provided in the present invention.
Figure 6B:
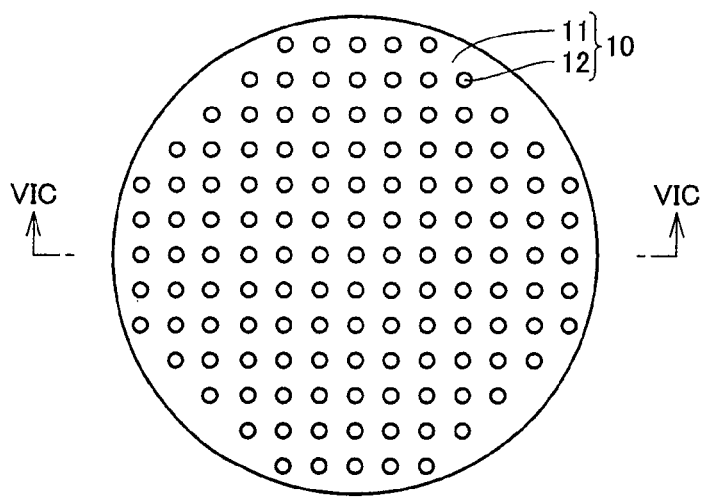
FIG. 6B is a schematic plan view of a GaN bulk crystalline body including a first crystalline region and a second, dotted crystalline region, and a method of producing the same, as provided in the present invention.
Figure 6C:
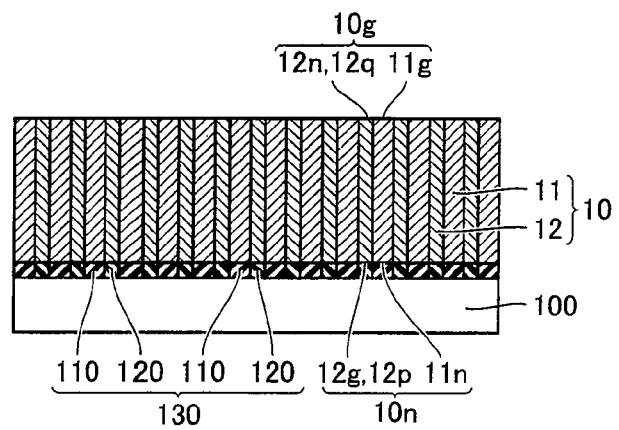
FIG. 6C is a schematic cross section of FIGS. 6A and 6B, as taken along a cross section VIC-VIC.

Then GaN bulk crystalline body 10 is grown on mask layer 130 to provide a first crystalline region 11 on first mask layer 110 and a second crystalline region 12 on second mask layer 120 with reference to FIG. 6C. For example if vapor deposition is employed to grow a GaN bulk crystalline body, decreasing a source gas of nitrogen in partial pressure facilitates obtaining second crystalline region 12 formed of a single crystal having the [0001] direction inverted relative to the first crystalline region. Furthermore, increasing the source gas of nitrogen in partial pressure facilitates obtaining second crystalline region 12 formed of a polycrystal. Furthermore the source gas of nitrogen having some partial pressure allows second crystalline region 12 to be formed of a portion formed of a single crystal having the [0001] direction inverted relative to the first crystalline region, and a polycrystalline portion.

Figure 5A:
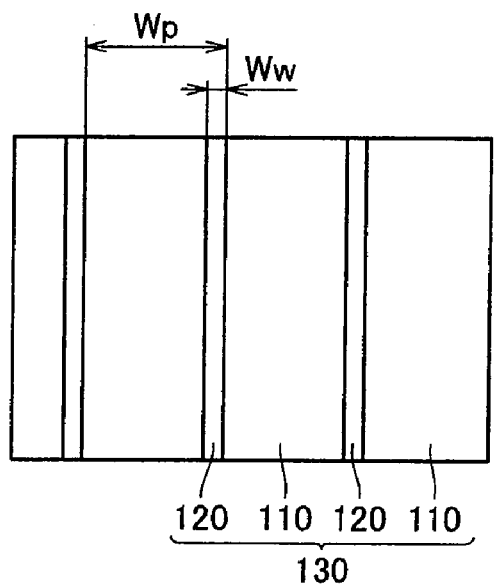
FIGS. 5A and 5B schematically show patterns of stripes and dots, respectively, for a second mask layer of a mask layer employed to grow a GaN bulk crystalline body employed in the present invention
Figure 5B:
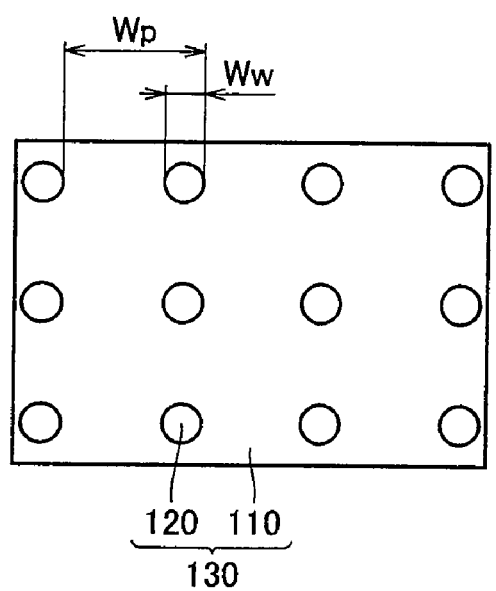

Thus on mask layer 130 GaN bulk crystalline body 10 including first crystalline region 11 and second crystalline region 12, as shown in FIG. 6A or 6B, is obtained. To facilitate forming first crystalline region 11 and second crystalline region 12 in GaN bulk crystalline body 10, second, striped mask layer 120 preferably has a width Ww of 10 µm to 100 µm and a pitch Wp of 100 µm to 1,000 µm (FIG. 5A) and second, dotted mask layer 120 preferably has width Ww of 10 µm to 200 µm and pitch Wp of 100 µm to 5,000 µm (FIG. 5B).

The thin GaN film-joined substrate of embodiment 1 is used as a substrate for a GaN-based semiconductor device. Accordingly the substrate different in type is also required to endure the environment in which a GaN-based semiconductor layer is grown on the thin film of GaN. Accordingly, the thin GaN film-joined substrate of embodiment 1 is preferably formed of a substrate different in type and a thin film of GaN (coefficient of thermal expansion: $5.6 \times 10^{-6}$ K$^{-1}$) that have a small difference in coefficient of thermal expansion. For example, the substrate different in type preferably has a coefficient of thermal expansion of at least $1 \times 10^{-8}$ K$^{-1}$ and at most $1 \times 10^{-5}$ K$^{-1}$. Substrates different in type that are preferable in this regard are a sapphire substrate, an AlN substrate, a SiC substrate, a MgO substrate, a ZnO substrate, a ZnS substrate, a carbon substrate, a GaAs substrate, a diamond substrate, a Ga$_2$O$_3$ substrate, a ZrB$_2$ substrate, and the like.

In the thin GaN film-joined substrate of embodiment 1 preferably the substrate different in type also has a heat resistance to at least 1,200° C. to be able to endure the environment in which a GaN-based semiconductor layer is grown on the thin film of GaN. Substrates different in type that are preferable in this regard are a sapphire substrate, an AlN substrate, a SiC substrate, a ZnSe substrate, a Si substrate, a MgO substrate, a ZnO substrate, a ZnS substrate, a quartz substrate, a carbon substrate, a diamond substrate, a Ga$_2$O$_3$ substrate, a ZrB$_2$ substrate, and the like.

In the thin GaN film-joined substrate of embodiment 1 preferably the substrate different in type is also anti-corrosive to be able to endure the environment in which a GaN-based semiconductor layer is grown on the thin film of GaN. Being anti-corrosive as referred to herein indicates being unetchable by hydrogen chloride (HCl) gas, ammonium (NH$_3$) gas or a similar crystal growing ambient gas at at least 1,200° C., a temperature allowing a GaN-based semiconductor layer to be epitaxially grown. Substrates different in type that are preferable in this regard are a sapphire substrate, an AlN substrate, a SiC substrate, a ZnSe substrate, a Si substrate, a MgO substrate, a ZnO substrate, a ZnS substrate, a quartz substrate, a carbon substrate, a diamond substrate, a Ga$_2$O$_3$ substrate, a ZrB$_2$ substrate, and the like.

In the thin GaN film-joined substrate of embodiment 1 preferably the substrate different in type is readily etchable away or removable by a similar chemical process as it may be removed for a GaN-based semiconductor device having some structure. Substrates different in type that are preferable in this regard are a ZnSe substrate, a Si substrate, a MgO substrate, a ZnO substrate, a ZnS substrate, a quartz substrate, a carbon substrate, a diamond substrate, a $Ga_2O_3$ substrate, and the like.

In the thin GaN film-joined substrate of embodiment 1 preferably the substrate different in type is electrically conductive in view of fabricating a GaN-based semiconductor device that has opposite main surfaces provided with electrodes and thus allows electrical conduction between the main surfaces. Substrates different in type that are preferable in this regard are a SiC substrate, an Si substrate, a GaAs substrate, a carbon substrate, and the like.

In the thin GaN film-joined substrate of embodiment 1 the substrate different in type may be of a single crystal or a polycrystal. Furthermore, it may be of a crystal of a composition having AlN and $Al_2O_3$ combined together. Furthermore, substrates different in type that are formed of polycrystals of AlN, SiC, $Ga_2O_3$, MgO, ZnO, $Al_2O_3$, and the like can advantageously be used in view of matching the substrate different in type to the thin film of GaN in coefficient of thermal expansion or contributing to reduced cost.

Embodiment 2

The present invention provides a first GaN-based semiconductor device in one embodiment. With reference to FIG. 1(e) it includes substrate 20 different in type, or chemical composition, from GaN, thin film of GaN 10a having a thickness of at least 0.1 µm and at most 100 µm and joined on substrate 20 different in type, and at least one GaN-based semiconductor layer 30 deposited on thin film of GaN 10a. Such a first GaN-based semiconductor device 2 that has GaN-based semiconductor layer 30 on thin film of GaN 10a can be fabricated inexpensively and have good characteristics. Note that GaN-based semiconductor as referred to herein indicates a semiconductor having a chemical composition including GaN, such as $Al_{1-x-y}Ga_xIn_yN$, wherein 0<x, 0≦y, and x+y≦1. Note that while in FIG. 1 substrate 20 different in type is shown as an electrically conductive substrate, it may be an insulating substrate.

In accordance with the present invention the first GaN-based semiconductor device is fabricated in a method, as provided in one embodiment, as described hereinafter with reference to FIG. 1(e). The method employs thin GaN film-joined substrate 1 of embodiment 1 (FIG. 1(d)) to fabricate first GaN-based semiconductor device 2, and includes the step of growing at least one GaN-based semiconductor layer 30 on a main surface of thin film of GaN 10a of thin GaN film-joined substrate 1. Such method allows a GaN-based semiconductor device having better characteristics to be fabricated at reduced cost.

At least one GaN-based semiconductor layer may be grown on thin film of GaN 10a in any method. Preferably, it is grown by HYPE, MOCVD or similar vapor deposition for epitaxial growth.

In the first GaN-based semiconductor device of embodiment 2 preferably the thin film of GaN, as well as that of the thin GaN film-joined substrate of embodiment 1, has a dislocation density of at most $1\times10^9$ $cm^{-2}$ and is electrically conductive (e.g., has a carrier density of at least $1\times10^{17}$ $cm^{-3}$), and includes a first crystalline region of a single crystal, and a second crystalline region including at least one of a portion formed of a single crystal having a [0001] direction inverted relative to the first crystalline region and a polycrystalline portion.

In the first GaN-based semiconductor device of embodiment 2 preferably the substrate different in type, as well as that of the thin GaN film-joined substrate of embodiment 1, has a small difference in coefficient of thermal expansion from the thin film of GaN (coefficient of thermal expansion: $5.6\times10^{-6}$ $K^{-1}$) (e.g., has a coefficient of thermal expansion of at least $1\times10^{-8}$ $K^{-1}$ and at most $1\times10^{-5}$ $K^{-1}$), has a heat resistance to at least 1,200° C., is anti-corrosive, has a larger band gap than the thin film of GaN, is readily etchable away or removable by a similar chemical process, and is electrically conductive.

Embodiment 3

The present invention provides a second GaN-based semiconductor device in one embodiment. With reference to FIG. 1(g) it includes thin film of GaN 10a having a thickness of at least 0.1 µm and at most 100 µm, at least one GaN-based semiconductor layer deposited on thin film of GaN 10a, and a radiating and electrically conductive substrate 40 joined on an outermost layer of GaN-based semiconductor layer 30. Such a second GaN-based semiconductor device 3 that has GaN-based semiconductor layer 30 on thin film of GaN 10a can be fabricated inexpensively and have good characteristics. Furthermore second GaN-based semiconductor layer 3 having radiating and electrically conductive substrate 40 joined on the outermost layer of GaN-based semiconductor layer 30 can effectively dissipate heat generated when a high current is passed. A high output, GaN-based semiconductor device (a GaN-based, high luminance LED in particular) can thus be obtained.

In accordance with the present invention the second GaN-based semiconductor device is fabricated in a method, as provided in one embodiment, as described hereinafter with reference to FIGS. 1(e)-1(g). The method employs first GaN-based semiconductor device 2 of embodiment 2 to fabricate second GaN-based semiconductor device 3, and includes the steps of: joining a radiating and conductive plate on an outermost surface of GaN-based semiconductor layer 30 of first GaN-based semiconductor device 2 (FIG. 1(f); and separating thin film of GaN 10a and substrate 20 different in type from each other (FIG. 1(g)). Such method can provide a semiconductor device with electrodes at opposite main surfaces to achieve a reduced chip size, and thus provide a GaN-based semiconductor device at reduced cost.

The radiating and electrically conductive plate may be joined on the outermost layer of the GaN-based semiconductor layer in any manner. Preferably, it is joined with solder. The radiating and electrically conductive plate indicates an electrically conductive substrate externally dissipating heat stored in the semiconductor device. A Cu plate, a CuW plate and the like are preferably used as such substrates can provide large heat radiation and are close in coefficient of thermal expansion to the GaN-based semiconductor layer.

In the second GaN-based semiconductor device of embodiment 3 preferably the thin film of GaN, as well as that of the thin GaN film-joined substrate of embodiment 1, has a dislocation density of at most $1\times10^9$ $cm^{-2}$ and is electrically conductive (e.g., has a carrier density of at least $1\times10^{17}$ $cm^{-3}$), and includes a first crystalline region of a single crystal, and a second crystalline region including at least one of a portion formed of a single crystal having a [0001] direction inverted relative to the first crystalline region and a polycrystalline portion.

Note that with reference to FIGS. 1(e) and 1(g) the first and second GaN-based semiconductor devices of the first and third embodiments, respectively, can be understood as a GaN-based semiconductor device including thin film of GaN 10a having a thickness of at least 0.1 µm and at most 100 µm, at least one GaN-based semiconductor layer 30 deposited on thin film of GaN 10a, and a substrate joined on one of thin film of GaN 10a and an outermost layer of GaN-based semiconductor layer 30. Note that a GaN-based semiconductor device having substrate 20 different in type joined to thin film of GaN 10a as a substrate corresponds to the first GaN-based semiconductor device, and a GaN-based semiconductor device having radiating and electrically conductive plate 40 joined on the outermost layer of GaN-based semiconductor layer 30 as a substrate corresponds to the second GaN-based semiconductor device.

EXAMPLES

Comparative Example 1

(1) Producing and Polishing GaN Bulk Crystalline Body

Initially with reference to FIG. 1(a) HVPE was employed to grow GaN bulk crystalline body 10 having a diameter of two inches (50.8 mm) and a thickness of 10 mm on underlying substrate 100 implemented by a GaAs substrate, for which a (111) Ga plane was used as a crystal growth plane, or a sapphire substrate, for which a (0001) plane was used as a crystal growth plane.

GaN bulk crystalline body 10 was grown after first mask layer 110 shown in FIG. 4A or 4B was formed on underlying substrate 100. The FIG. 4A first mask layer 110 had opening 110w in the form of a stripe of having width Vw of 2 μm with pitch Vp of 8 μm, and The FIG. 4B first mask layer 110 had opening 110w in the form of a dot having width Vw of 2 μm with pitch Vp of 4 μm. Crystal growth through opening 110w of such mask layer 110 provided GaN bulk crystalline body 10 having a dislocation density of at least $1 \times 10^5$ cm$^{-2}$ and at most $1 \times 10^9$ cm$^{-2}$. The GaN bulk crystalline body's dislocation density was measured by cathode luminescence (CL) and etch pit density (EPD). Furthermore, in the crystal growth, SiCl$_4$ gas was introduced as dopant to provide electrically conductive GaN bulk crystalline body 10 having a carrier density of $7 \times 10^{17}$ cm$^{-3}$ and a specific resistance of 0.05 Ωcm. The GaN bulk crystalline body's carrier density and specific resistance were measured with hole measurement equipment at room temperature (25° C.).

Then from GaN bulk crystalline body 10 underlying substrate 100 was ground away and thus mechanically removed to provide 10 mm thick, free standing GaN bulk crystalline body 10. Then with reference to FIG. 1(b) GaN bulk crystalline body 10 had N surface 10n (i.e., a surface to be joined) ground and thus mirror finished.

(2) Implanting Hydrogen Ions into GaN Bulk Crystalline Body

Then with reference to FIG. 2(a) ion implantation equipment was employed to implant hydrogen ions 140 in a dose of $1 \times 10^{17}$ cm$^{-2}$ and with an acceleration voltage of 50 keV into GaN bulk crystalline body 10 at a position corresponding to plane 10t located at a depth T of 0.1 μm from N surface 10n (the surface to be joined).

(3) Joining Substrate Different in Type to GaN Bulk Crystalline Body

Then with reference to FIG. 2(b) GaN bulk crystalline body 10 had N surface 10n (the surface to be joined) etched 150 using dry etching equipment with argon (Ar) gas to be a clean surface. The etching with Ar gas was done with an RF power of 100 W, an Ar gas flow rate of 50 sccm (note that the unit "sccm" indicates a volume (cm$^3$) of a gas flowing for one minute in a standard condition (i.e., 273 K and 1.013 hPa), and an ambient pressure of 13.3 Pa. Substrate 20 different in type to be joined to the GaN bulk crystalline body was implemented by a sapphire substrate, which had a surface to be joined etched with Ar gas to be a clean surface. The etching with Ar gas was done with an RF power of 100 W, an Ar gas flow rate of 50 sccm, and an ambient pressure of 6.7 Pa. The surface of the GaN bulk crystalline body that was to be joined, which corresponds to N surface 10n, had maximum surface roughness Rmax of 28 μm, average surface roughness Ra of 12.8 nm, and an off-angle of 0.01° with respect to the (0001) plane. Herein the off angle of 0.01° is considered as indicating that the N surface matches the (0001) plane in view of the precision of the method employed for the measurement. Maximum surface roughness Rmax was measured with a flatness tester across the surface to be joined. Average surface roughness Ra was measured with an optical interference surface profiler in an area of 100 μm×100 μm of the surface to be joined, at a center point and peripheral four points for a total of five points. The off-angle of the surface to be joined with respect to the (0001) plane was measured by x ray diffraction at a center of that surface of the GaN bulk crystalline body which was to be joined.

Then with reference to FIG. 2(c) surface activation was employed to join GaN bulk crystalline body 10 and substrate 20 different in type together such that that surface of GaN bulk crystalline body 10 which was to be joined (i.e., N surface 10n), and that surface of substrate 20 different in type which was to be joined, that had been cleaned contact each other.

(4) Dividing GaN Bulk Crystalline Body

Then with reference to FIG. 2(d) GaN bulk crystalline bodies 10 having the aforementioned various substrates 20 different in type joined thereto were subjected to a heat treatment at 400° C. to embrittle a hydrogen ion-implanted plane (a plane to which hydrogen ions were implanted at item (2)) to divide the GaN bulk crystalline body at that plane. Thus there were obtained thin GaN film-joined substrates 1 including the aforementioned various substrates 20 different in type and thin film of GaN 10a joined on substrates 20 different in type and having a thickness of 0.1 μm. The above process was repeated to obtain 24 thin GaN film-joined substrates 1.

(5) Evaluating Thin Film of GaN in Adhesiveness

Thin GaN film-joined substrate 1 thus obtained was examined in the strength with which the thin film of GaN and the substrate different in type were joined together. More specifically, the adhesion between the thin film of GaN and the substrate different in type was evaluated, as follows: the thin GaN film-joined substrate was placed in MOCVD equipment and temperature was increased and decreased in a gaseous ammonium (NH$_3$) ambient from 600° C. to 1,200° C. at a rate of 10° C./min three times repeatedly. Subsequently the thin GaN film-joined substrate was removed from the MOCVD equipment and observed with an optical microscope for whether the thin film of GaN was peeled off. A thin GaN film joined substrate having at least 90% of the thin film of GaN remaining on the area of the substrate different in type was determined as a confirming product, otherwise as a defective product. Of the 24 thin GaN film-joined substrates, only two substrates were confirming products.

Note that the substrate different in type was also implemented by an AlN substrate, a SiC substrate, a ZnSe substrate, an Si substrate, a MgO substrate, a ZnO substrate, a ZnS substrate, a quartz substrate, a carbon substrate, and a diamond substrate, and substantially similar results were obtained.

Example 1

A GaN bulk crystalline body was obtained similarly as described in comparative example 1, except that GaN bulk crystalline body 10 had N surface 10n (the surface to be joined) ground and lapped and thus mirror finished. That surface of the obtained GaN bulk crystalline body which was to be joined (the N surface) had a maximum surface roughness Rmax of 18 μm, an average surface roughness Ra of 5.1 nm and an off-angle of 0.01° with respect to a (0001) plane. This GaN bulk crystalline body was joined on a sapphire substrate (a substrate different in type), similarly as described in comparative example 1, to produce a thin GaN film-joined substrate, and the adhesion between the thin film of GaN and the substrate different in type was evaluated. Of 24 thin GaN film-joined substrates, 13 substrates were confirming products.

Example 2

A GaN bulk crystalline body was obtained similarly as described in comparative example 1, except that GaN bulk crystalline body 10 had N surface 10n (the surface to be joined) ground and lapped and polished and thus mirror finished. That surface of the obtained GaN bulk crystalline body which was to be joined (the N surface) had a maximum surface roughness Rmax of 7 μm, an average surface roughness Ra of 5.1 nm and an off-angle of 0.01° with respect to a (0001) plane. This GaN bulk crystalline body was joined on a sapphire substrate (a substrate different in type), similarly as described in example 1, to produce a thin GaN film-joined substrate, and the adhesion between the thin film of GaN and the substrate different in type was evaluated. Of 24 thin GaN film-joined substrates, 16 substrates were confirming products.

Example 3

A GaN bulk crystalline body was obtained similarly as described in example 2, except that GaN bulk crystalline body 10 had N surface 10n (the surface to be joined) ground, lapped and polished and thus mirror finished and subsequently etched with chlorine ($Cl_2$) gas to be a clean surface. The etching with $Cl_2$ gas was done with an RF power of 100 W, a $Cl_2$ gas flow rate of 100 sccm, and an ambient pressure of 13.3 Pa. That surface of the obtained GaN bulk crystalline body which was to be joined (the N surface) had a maximum surface roughness Rmax of 7 μm, an average surface roughness Ra of 0.7 nm and an off-angle of 0.01° with respect to a (0001) plane. This GaN bulk crystalline body was joined on a sapphire substrate (a substrate different in type), similarly as described in example 1, to produce a thin GaN film-joined substrate, and the adhesion between the thin film of GaN and the substrate different in type was evaluated. Of 24 thin GaN film-joined substrates, 17 substrates were confirming products.

Example 4

A GaN bulk crystalline body was obtained similarly as described in example 3, except that an underlying substrate implemented by a GaAs substrate having a crystal growth plane inclined from a (111) Ga plane by 15° was used, that a GaN bulk crystalline body of two inches (50.8 mm) in diameter was grown to have a thickness of 10 mm, and that the GaN bulk crystalline body had a surface to be joined (i.e., a surface thereof that is closer to the underlying substrate) ground, lapped and polished. That surface of the obtained GaN bulk crystalline body which was to be joined had a maximum surface roughness Rmax of 7 μm, an average surface roughness Ra of 0.7 nm and an off-angle of 15° with respect to a (0001) plane. This GaN bulk crystalline body was joined on a sapphire substrate (a substrate different in type), similarly as described in example 1, to produce a thin GaN film-joined substrate, and the adhesion between the thin film of GaN and the substrate different in type was evaluated. Of 24 thin GaN film-joined substrates, 19 substrates were confirming products.

Example 5

A GaN bulk crystalline body was obtained similarly as described in example 4, except that an underlying substrate implemented by a GaAs substrate having a crystal growth plane inclined from a (111) Ga plane by 1.7° was used. That surface of the obtained GaN bulk crystalline body which was to be joined (i.e., a surface thereof that is closer to the underlying substrate) had a maximum surface roughness Rmax of 7 μm, an average surface roughness Ra of 0.7 nm and an off-angle of 1.7° with respect to a (0001) plane. This GaN bulk crystalline body was joined on a sapphire substrate (a substrate different in type), similarly as described in example 1, to produce a thin GaN film-joined substrate, and the adhesion between the thin film of GaN and the substrate different in type was evaluated. Of 24 thin GaN film-joined substrates, 21 substrates were confirming products.

Example 6

A GaN bulk crystalline body was obtained similarly as described in example 4, except that an underlying substrate implemented by a GaAs substrate having a crystal growth plane inclined from a (111) Ga plane by 0.8° was used. That surface of the obtained GaN bulk crystalline body which was to be joined (i.e., a surface thereof that is closer to the underlying substrate) had a maximum surface roughness Rmax of 7 μm, an average surface roughness Ra of 0.7 nm and an off-angle of 0.8° with respect to a (0001) plane. This GaN bulk crystalline body was joined on a sapphire substrate (a substrate different in type), similarly as described in example 1, to produce a thin GaN film-joined substrate, and the adhesion between the thin film of GaN and the substrate different in type was evaluated. Of 24 thin GaN film-joined substrates, 22 substrates were confirming products.

Example 7

A GaN bulk crystalline body was obtained similarly as described in example 4, except that an underlying substrate implemented by a GaAs substrate inclined from a (111) Ga plane by 0.2° was used. That surface of the obtained GaN bulk crystalline body which was to be joined (i.e., a surface thereof that is closer to the underlying substrate) had a maximum surface roughness Rmax of 7 μm, an average surface roughness Ra of 0.7 nm and an off-angle of 0.2° with respect to a (0001) plane. This GaN bulk crystalline body was joined on a sapphire substrate (a substrate different in type), similarly as described in example 1, to produce a thin GaN film-joined substrate, and the adhesion between the thin film of GaN and the substrate different in type was evaluated. Of 24 thin GaN film-joined substrates, 22 substrates were confirming products.

Example 8

(1) Producing and Polishing GaN Bulk Crystalline Body

GaN bulk crystalline body 10 of two inches (50.8 mm) in diameter was grown to have a thickness of 10 mm, similarly as described in example 1, except that GaN bulk crystalline body 10 was grown after mask layer 130 including first and second mask layers 110 and 120 shown in FIG. 5A or 5B was provided on underlying substrate 100. Underlying substrate 100 was implemented by a GaAs substrate having a crystal growth plane inclined from a (111) Ga plane by 0.5°.

The FIG. 5A mask layer 130 includes second mask layer 120 in the form of a stripe having width Ww of 100 μm with pitch Wp of 500 μm and The FIG. 5B mask layer 130 includes second mask layer 120 in the form of a dot having diameter Ww of 100 μm with pitch Wp of 1,000 μm. Crystal growth through opening of such mask layer 130 provided a GaN bulk crystalline body including first crystalline region 11 deposited on first mask layer 110 and second crystalline region 12 deposited on second mask layer 120 with reference to FIGS. 6A-6C. Note that this GaN bulk crystalline body was grown by HYPE with a source gas of nitrogen increased in partial pressure (to at least 23 kPa, more specifically) and accordingly, second crystalline region 12 was formed of a polycrystal.

Figure 7:
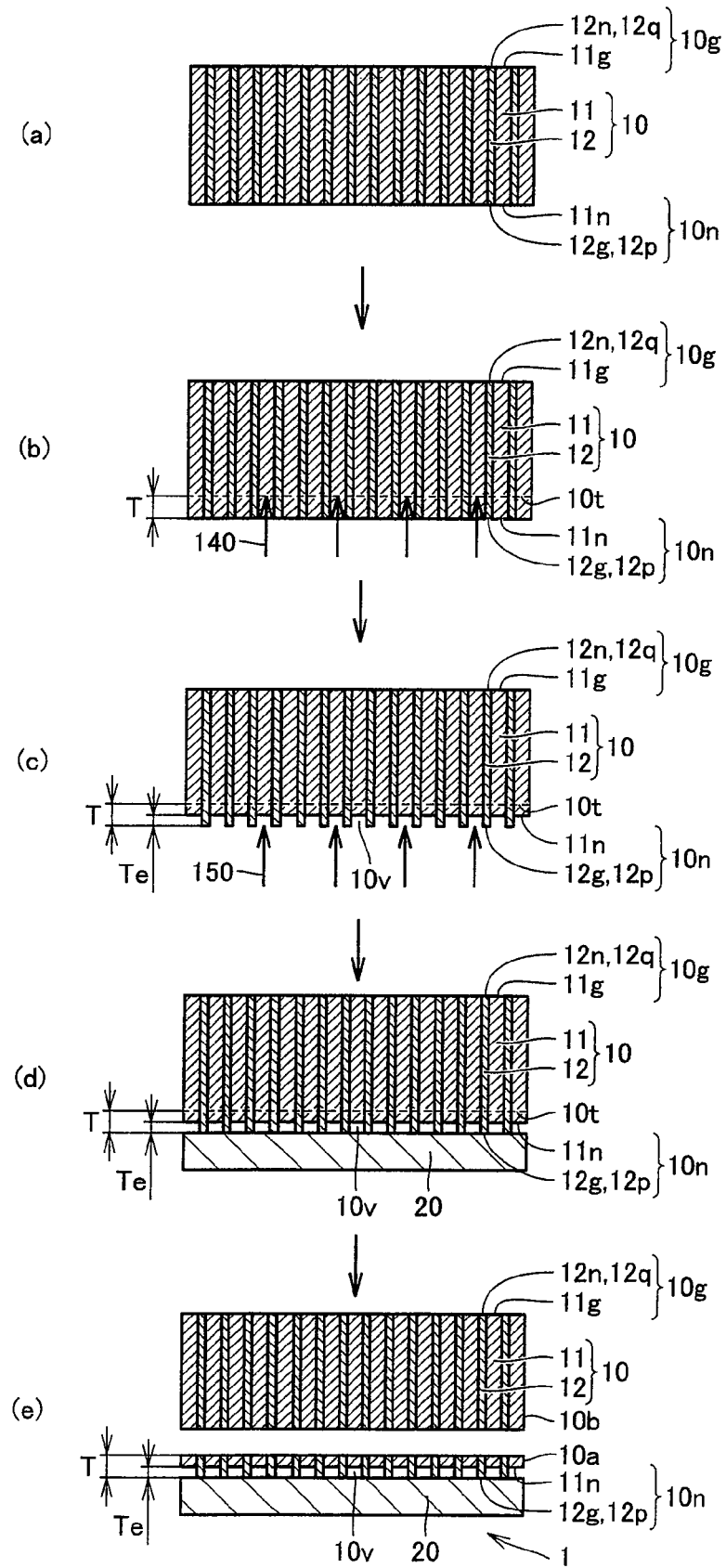
FIGS. 7(a)-7(e) are cross sections for schematically illustrating still another example of the method of producing the thin GaN film-joined substrate in accordance with the present invention. More specifically.

Then with reference to FIGS. 6C and 7(a), similarly as described in example 1, a 10 mm thick, free standing GaN bulk crystalline body 10 was provided, and had a surface to be joined (i.e., a surface thereof closer to the underlying substrate) polished and thus mirror finished. Note that strictly, the surface has an off angle of 0.5° with respect to N surface 10n. However, this angle is small, and can be approximated by N surface 10n. Accordingly in the following description the surface will be described such that it is approximated by N surface 10n.

(2) Implanting Hydrogen Ions into GaN Bulk Crystalline Body

Then with reference to FIG. 7(b) a method and condition similar to that of example 1 was applied to implant hydrogen ions 140 into GaN bulk crystalline body 10 at a position corresponding to plane 10t located at depth T of 0.1 μm from that surface of GaN bulk crystalline body 10 which was to be joined (i.e., the surface approximated by N surface 10n (i.e., an N surface 11n of first crystalline region 11 and a polycrystalline surface 12p of second crystalline region 12).

(3) Joining Substrate Different in Type to GaN Bulk Crystalline Body

Then with reference to FIG. 7(c) GaN bulk crystalline body 10 had the surface to be joined (the surface approximated by N surface 10n (i.e., N surface 11n of first crystalline region 11 and polycrystalline surface 12p of second crystalline region 12)) etched 150 using dry etching equipment with $Cl_2$ gas to be a clean surface. Substrate 20 different in type to be joined to the GaN bulk crystalline body was implemented by a sapphire substrate, which had a surface to be joined etched with Ar gas to be a clean surface. The etching with $Cl_2$ gas and that with Ar gas were done under a condition similar to that of example 3. Note that with reference to FIG. 7(c), if second crystalline region 12 is formed of a polycrystal having an average grain size of approximately at least 5 μm, N surface 11n of first crystalline region 11 is etched faster than polycrystalline surface 12p of second crystalline region 12. Accordingly at that surface of the GaN bulk crystalline body which is to be joined (i.e., that surface of GaN bulk crystalline body 10 which is approximated by N surface 10n) there results a recess and protrusion (or a gap 10v) of approximately a few tens nm as shown in FIG. 7(c). That surface of the GaN bulk crystalline body which was to be joined, excluding gap 10v, had a maximum surface roughness Rmax of 7 μm, an average surface roughness Ra of 0.7 nm and an off-angle of 0.5° with respect to a (0001) plane. This GaN bulk crystalline body was joined on a sapphire substrate (a substrate different in type), similarly as described in example 1.

Note that if second crystalline region 12 is formed of a polycrystal having an average grain size of approximately less than 5 μm, N surface 11n of first crystalline region 11 is etched more slowly than polycrystalline surface 12p of second crystalline region 12. Accordingly, in contrast to FIG. 7(c), at that surface of the GaN bulk crystalline body which is to be joined (i.e., that surface of GaN bulk crystalline body 10 which is approximated by N surface 10n) there results a recess and protrusion (or gap 10v) of approximately a few tens nm such that polycrystalline surface 12p of second crystalline region 12 is recessed relative to surface 11n of first crystalline region 11.

The GaN bulk crystalline body with the sapphire substrate joined thereto was divided, similarly as described in example 1, to obtain a thin GaN film-joined substrate. The thin GaN film-joined substrate was evaluated for the adhesion between the thin film of GaN and the substrate different in type. Of 24 thin GaN film-joined substrates, all of them (i.e., 24 substrates) were confirming products.

While examples 1-8 employed a substrate different in type that was implemented by a sapphire substrate, such examples with substrates different in type that were implemented by an AlN substrate, a SiC substrate, a ZnSe substrate, a Si substrate, a MgO substrate, a ZnO substrate, a ZnS substrate, a quartz substrate, a carbon substrate, and a diamond substrate also provided substantially similar results.

Furthermore in examples 4-8 an underlying substrate having a crystal growth plane having a large off-angle with respect to a particular crystal plane was used to grow a GaN bulk crystalline body having a surface to be joined that has a large off-angle with respect to a (0001) plane. However, the GaN bulk crystalline body having a surface to be joined that has a large off-angle with respect to the (0001) plane may be grown not only in the method as described above; it can also be obtained as follows: an underlying substrate having a crystal growth plane having an off-angle of 0° or an extremely small degree(s) with respect to a particular crystal plane may be used to grow a crystal which may in turn be cut, ground or lapped and polished to provide a surface having a large off-angle with respect to the (0001) plane.

Furthermore while in examples 1-8 hydrogen ions were implanted into the GaN bulk crystalline body, it has also been confirmed that employing helium ions or nitrogen ions in place of hydrogen ions also provides a similar result.

Example 9

The present example provides one specific example of the thin GaN film-joined substrate of embodiment 1 and embodiment 1A by a thin GaN film-joined substrate having a 0.1 μm thick, electrically conductive thin film of GaN joined. The thin GaN film-joined substrate of the present example is preferably used as substrates for a light emitting diode (LED), a laser diode (LD) and other similar light emitting devices.

(1) Producing and Polishing GaN Bulk Crystalline Body

Initially with reference to FIG. 1(a) HVPE was employed to grow GaN bulk crystalline body 10 having a diameter of two inches (50.8 mm) and a thickness of 10 mm on underlying substrate 100 implemented by a GaAs substrate having a crystal growth plane inclined from a (111) Ga plane by 0.4°.

GaN bulk crystalline body 10 was grown after first mask layer 110 shown in FIG. 4A or 4B was formed on underlying substrate 100. The FIG. 4A first mask layer 110 had opening 110w in the form of a stripe of having width Vw of 2 μm with pitch Vp of 8 μm, and The FIG. 4B first mask layer 110 had opening 110w in the form of a dot having width Vw of 2 μm with pitch Vp of 4 μm. Crystal growth through opening 110w of such mask layer 110 provided GaN bulk crystalline body 10 having a dislocation density of at least $1\times10^5$ cm$^{-2}$ and at most $1\times10^9$ cm$^{-2}$. The GaN bulk crystalline body's dislocation density was measured by cathode luminescence (CL) and etch pit density (EPD). Furthermore, in the crystal growth, $O_2$ gas was introduced as dopant to provide electrically conductive GaN bulk crystalline body 10 having a carrier density of $1\times10^{17}$ cm$^{-3}$ and a specific resistance of 0.1 Ωcm. The GaN bulk crystalline body's carrier density and specific resistance were measured with hole measurement equipment at room temperature (25° C.).

Then from GaN bulk crystalline body 10 underlying substrate 100 was ground away and thus mechanically removed to provide 10 mm thick, free standing GaN bulk crystalline body 10. Then with reference to FIG. 1(b) GaN bulk crystalline body 10 had a surface to be joined (i.e., a surface thereof approximated by N surface 10n) ground, and lapped and polished, and thus mirror finished.

(2) Implanting Hydrogen Ions into GaN Bulk Crystalline Body

Then with reference to FIG. 2(a) ion implantation equipment was employed to implant hydrogen ions 140 in a dose of $1\times10^{17}$ cm$^{-2}$ and with an acceleration voltage of 50 keV into GaN bulk crystalline body 10 at a position corresponding to plane 10t located at depth t of 0.1 μm from that surface of GaN bulk crystalline body 10 which was to be joined (i.e., the surface approximated by N surface 10n).

(3) Joining Substrate Different in Type to GaN Bulk Crystalline Body

Then with reference to FIG. 2(b) GaN bulk crystalline body 10 had the surface to be joined (the surface approximated by N surface 10n) etched 150 using dry etching equipment with $Cl_2$ gas to be a clean surface. The etching with $Cl_2$ gas was done with an RF power of 100 W, a $Cl_2$ gas flow rate of 100 sccm, and an ambient pressure of 13.3 Pa. Substrate 20 different in type to be joined to the GaN bulk crystalline body was implemented by a sapphire substrate, an AlN substrate, a SiC substrate, a ZnSe substrate, a Si substrate, a MgO substrate, a ZnO substrate, a ZnS substrate, a quartz substrate, a carbon substrate, and a diamond substrate, and the substrates had their respective surfaces to be joined etched with Ar gas to be clean surfaces, respectively. The etching with Ar gas was done with an RF power of 100 W, an Ar gas flow rate of 50 sccm, and an ambient pressure of 6.7 Pa. Employing $Cl_2$ gas to chemically etch the GaN bulk crystalline body can chemically remove an oxide layer formed on a surface of the GaN bulk crystalline body. The GaN bulk crystalline body thus etched can have a surface flatter and hence joined with larger strength than that physically etched with Ar gas. That surface of the GaN bulk crystalline body which was to be joined had maximum surface roughness Rmax of 7 μm, average surface roughness Ra of 0.7 nm, and an off-angle of 0.4° with respect to a (0001) plane.

Then with reference to FIG. 2(c) surface activation was employed to join GaN bulk crystalline body 10 and each of the above various substrates 20 different in type together such that that surface of GaN bulk crystalline body 10 which was to be joined (i.e., N surface 10n) and that surface of substrate 20 different in type which was to be joined, that had been cleaned contact each other.

(4) Dividing GaN Bulk Crystalline Body

Then with reference to FIG. 2(d) GaN bulk crystalline bodies 10 having the aforementioned various substrates 20 different in type joined thereto were subjected to a heat treatment at 400° C. to embrittle a hydrogen ion-implanted plane (a plane to which hydrogen ions were implanted at item (2)) to divide the GaN bulk crystalline body at that plane. Thus there were obtained thin GaN film-joined substrates 1 including the aforementioned various substrates 20 different in type and thin film of GaN 10a joined on substrates 20 different in type and having a thickness of 0.1 μm. After GaN bulk crystalline body 10 has thin film of GaN 10a divided therefrom, GaN bulk crystalline body 10b remains, which is used to produce a subsequent thin GaN film-joined substrate.

The above process can be repeated to obtain from a 10 mm thick GaN bulk crystalline body 10,000 thin GaN film-joined substrates including a thin film of GaN of 0.1 μm thick. A 10 mm thick GaN bulk crystalline body cut with a wire saw, as conventional, can only yield 10 GaN substrates of 300 μm thick. In the present example a large number of thin GaN film-joined substrates can be obtained from a GaN bulk crystalline body and hence produced at a significantly reduced cost.

In the thin GaN film-joined substrate of the present example, as has been described in embodiment 1, the substrate different in type that has a coefficient of thermal expansion of at least $1\times10^{-8}$ K$^{-1}$ and at most $1\times10^{-5}$ K$^{-1}$, a heat resistance to at least 1,200° C., anti-corrosiveness, and other similar characteristics is suitably used.

Furthermore the thin GaN film-joined substrate of the present example is used as a substrate for a light emitting device. Accordingly, to increase the device's light extraction efficiency, the substrate different in type that is implemented by a substrate having a larger bandgap than GaN, such as a sapphire substrate, an AlN substrate, a MgO substrate, a ZnO substrate, a ZnS substrate, a quartz substrate, a diamond substrate and the like, is preferably used.

Furthermore the thin GaN film-joined substrate of the present example is used as a substrate for a light emitting device. Accordingly, to provide the light emitting device with electrodes on opposite main surfaces, respectively, to allow electrical conduction between the main surfaces, the substrate different in type implemented by an electrically conductive substrate, such as a SiC substrate, a Si substrate, a carbon substrate, and the like, is preferably used.

Example 10

The present example provides one specific example of the thin GaN film-joined substrate of embodiment 1 and embodiment 1B by a thin GaN film-joined substrate having a 100 μm thick, electrically conductive thin film of GaN joined. The thin GaN film-joined substrate of the present example is preferably used as substrates for an LED, an LD and other similar light emitting devices.

(1) Producing and Polishing GaN Bulk Crystalline Body

Similarly as described in example 9, a free standing GaN bulk crystalline body 10 having a diameter of two inches (50.8 mm) and a thickness of 10 mm (dislocation density: at least $1\times10^5$ cm$^{-2}$ and at most $1\times10^9$ cm$^{-2}$, carrier density: $2\times10^{18}$ cm$^{-3}$, specific resistance: 0.02 Ωcm) was obtained. Then, similarly as described in example 9, GaN bulk crystalline body 10 had a surface to be joined (i.e., a surface thereof approximated by N surface 10n) polished and thus mirror finished.

(2) Joining Substrate Different in Type to GaN Bulk Crystalline Body

Then with reference to FIG. 3(a) GaN bulk crystalline body 10 had the surface to be joined (the surface approximated by N surface 10n) etched 150 using dry etching equipment with $Cl_2$ gas to be a clean surface. Substrate 20 different in type to be joined to the GaN bulk crystalline body was implemented by a sapphire substrate, an AlN substrate, a SiC substrate, a ZnSe substrate, a Si substrate, a MgO substrate, a ZnO substrate, a ZnS substrate, a quartz substrate, a carbon substrate, and a diamond substrate, a $Ga_2O_3$ substrate and a $ZrB_2$ substrate, and the substrates had their respective surfaces to be joined etched with Ar gas to be clean surfaces, respectively. The etching with $Cl_2$ gas and that with Ar gas were done under conditions similar to those applied in example 9. That surface of the GaN bulk crystalline body which was to be joined had maximum surface roughness Rmax of 7 µm, average surface roughness Ra of 0.7 nm, and an off-angle of 0.4° with respect to a (0001) plane. Then, with reference to FIG. 3(b), similarly as described in example 9, GaN bulk crystalline body 10 and each of the above, various types of substrates 20 different in type were joined together.

(3) Dividing GaN Bulk Crystalline Body

Then with reference to FIG. 3(c) GaN bulk crystalline body 10 was cut with an electro-discharging machine, a wire saw, an outer peripheral edge, or an inner peripheral edge at plane 10t having distance T of 100 µm from an interface thereof with substrate 20 different in type to obtain thin GaN film-joined substrate 1 including substrate 20 different in type and thin film of GaN 10a joined on substrate 20 different in type and having a thickness of 100 µm. After GaN bulk crystalline body 10 has thin film of GaN 10a divided therefrom, GaN bulk crystalline body 10b remains, which is used to produce a subsequent thin GaN film-joined substrate.

The above process can be repeated to obtain from a 10 mm thick GaN bulk crystalline body 20 thin GaN film-joined substrates including a thin film of GaN of 100 µm thick. A 10 mm thick GaN bulk crystalline body cut with a wire saw, as conventional, can only yield 10 GaN substrates of 300 µm thick. The present example also allowed a large number of thin GaN film-joined substrates to be obtained from a GaN bulk crystalline body and hence produced at a significantly reduced cost.

In the thin GaN film-joined substrate of the present example, as has been described in example 9, the substrate different in type that has a coefficient of thermal expansion of at least $1\times10^{-8}$ $K^{-1}$ and at most $1\times10^{-5}$ $K^{-1}$, a heat resistance to at least 1,200° C., anti-corrosiveness, a larger bandgap than GaN, electrical conductance, and other similar characteristics, is suitably used.

Example 11

The present example provides another specific example of the thin GaN film-joined substrate of embodiment 1 and embodiment 1A by a thin GaN film-joined substrate having joined thereto a 0.1 µm thick, electrically conductive thin film of GaN including a first crystalline region of a single crystal and a second crystalline region formed of a single crystal having a [0001] direction inverted relative to the first crystalline region. The thin GaN film-joined substrate of the present example is preferably used as substrates for an LED, an LD, and a similar light emitting device.

(1) Producing and Polishing GaN Bulk Crystalline Body

GaN bulk crystalline body 10 having a diameter of two inches (50.8 mm) and a thickness of 10 mm was grown, similarly as described in example 9, except that GaN bulk crystalline body 10 was grown after mask layer 130 including first and second mask layers 110 and 120 shown in FIG. 5A or 5B was provided on underlying substrate 100.

The FIG. 5A mask layer 130 includes second mask layer 120 in the form of a stripe having width Ww of 100 µm with pitch Wp of 500 µm and The FIG. 5B mask layer 130 includes second mask layer 120 in the form of a dot having diameter Ww of 100 µm with pitch Wp of 1,000 µm. Crystal growth through opening of such mask layer 130 provided GaN bulk crystalline body 10 including first crystalline region 11 deposited on first mask layer 110 and second crystalline region 12 deposited on second mask layer 120 with reference to FIGS. 6A-6C. Note that this GaN bulk crystalline body was grown by HVPE with a source gas of nitrogen decreased in partial pressure (to at most 23 kPa, more specifically) and accordingly, second crystalline region 12 was formed of a single crystal having a [0001] direction inverted relative to first crystalline region 11. Accordingly GaN bulk crystalline body 10 has N surface 10n including an N surface 11n of first crystalline region 11 and a Ga surface 12g of second crystalline region 12, and a Ga surface 10g including a Ga surface 11g of the first crystalline region and an N surface 12n of the second crystalline region. Furthermore the obtained GaN bulk crystalline body was electrically conductive, having a dislocation density of at least $1\times10^4$ $cm^{-2}$ and at most $1\times10^8$ $cm^{-2}$, a carrier density of $1\times10^{19}$ $cm^{-3}$ and a specific resistance of 0.005 Ωcm. Note that the GaN bulk crystalline body of the present example had dislocation density absorbed by second crystalline region 12 and was thus reduced in dislocation density to be smaller than that of example 9.

Then with reference to FIGS. 6C and 7(a), similarly as described in example 9, a 10 nm thick, free standing GaN bulk crystalline body 10 was provided, and had a surface to be joined (i.e., that surface approximated by N surface 10n) polished and thus mirror finished.

(2) Implanting Hydrogen Ions into GaN Bulk Crystalline Body

Then with reference to FIG. 7(b) a method and condition similar to that of example 9 was applied to implant hydrogen ions 140 into GaN bulk crystalline body 10 at a position corresponding to plane 10t located at depth T of 0.1 µm from that surface of GaN bulk crystalline body 10 which was to be joined (i.e., the surface approximated by N surface 10n (i.e., N surface 11n of first crystalline region 11 and Ga surface 12g of second crystalline region 12).

(3) Joining Substrate Different in Type to GaN Bulk Crystalline Body

Then with reference to FIG. 7(c) GaN bulk crystalline body 10 had the surface to be joined (the surface approximated by N surface 10n (i.e., N surface 11n of first crystalline region 11 and Ga surface 12g of second crystalline region 12)) etched 150 using dry etching equipment with $Cl_2$ gas to be a clean surface. Substrate 20 different in type to be joined to the GaN bulk crystalline body was implemented by a sapphire substrate, an AlN substrate, a SiC substrate, a ZnSe substrate, a Si substrate, a MgO substrate, a ZnO substrate, a ZnS substrate, a quartz substrate, a carbon substrate, a diamond substrate, a $Ga_2O_3$ substrate, and a $ZrB_2$ substrate, and the substrates had their respective surfaces to be joined etched with Ar gas to be clean surfaces. The etching with $Cl_2$ gas and that with Ar gas were done under conditions similar to those of example 9. Note that N surface 11n of first crystalline region 11 is etched faster than Ga surface 12g of second crystalline region 12. Accordingly at that surface of GaN bulk crystalline body 10 which was to be joined (i.e., the surface approximated by N surface 10n) there results a recess and protrusion (or gap 10v) of approximately a few tens nm as shown in FIG. 7(c). That surface of the GaN bulk crystalline body which was to be joined, excluding gap 10v, had a maximum surface roughness Rmax of 7 µm, an average surface roughness Ra of 0.7 nm and an off-angle of 0.4° with respect to a (0001) plane.

Then, with reference to FIG. 7(d), similarly as described in example 1, GaN bulk crystalline body 10 and each of the above various substrates 20 different in type were joined together. As GaN bulk crystalline body 10 had the N surface with the protrusion and recess of approximately a few tens nm, gap 10v regularly resulted between GaN bulk crystalline body 10 and substrate 20 different in type. Such gap 10v effectively alleviates a stress derived from a difference in coefficient of thermal expansion between a thin film of GaN and a substrate different in type, that is caused in growing a GaN-based semiconductor layer on thin film of GaN 10.

(4) Dividing GaN Bulk Crystalline Body

Then with reference to FIG. 7(e) GaN bulk crystalline bodies 10 with the aforementioned various substrates 20 different in type joined thereto were subjected to a heat treatment at 400° C. to embrittle a hydrogen ion-implanted plane (a plane to which hydrogen ions were implanted at item (2)) to divide the GaN bulk crystalline body at that plane. Thus there were obtained thin GaN film-joined substrates 1 including the aforementioned various substrates 20 different in type and thin film of GaN 10a joined on substrates 20 different in type and having a thickness of 0.1 μm. After GaN bulk crystalline body 10 has thin film of GaN 10a divided therefrom, GaN bulk crystalline body 10b remains, which is used to produce a subsequent thin GaN film-joined substrate.

The above process can be repeated to obtain from a 10 mm thick GaN bulk crystalline body 6,000 thin GaN film-joined substrates including a thin film of GaN of 0.1 μm thick. A 10 mm thick GaN bulk crystalline body cut with a wire saw, as conventional, can only yield 10 GaN substrates of 300 μm thick. In the present example a large number of thin GaN film-joined substrates can be obtained from a GaN bulk crystalline body and hence produced at a significantly reduced cost.

In the thin GaN film-joined substrate of the present example, as has been described in example 9, the substrate different in type that has a coefficient of thermal expansion of at least $1 \times 10^{-8}$ K$^{-1}$ and at most $1 \times 10^{-5}$ K$^{-1}$, a heat resistance to at least 1,200° C., anti-corrosiveness, a larger bandgap than GaN, electrical conductance, and other similar characteristics, is suitably used.

Example 12

The present example provides a still another specific example of the thin GaN film-joined substrate of embodiment 1 and embodiment 1A by a thin GaN film joined substrate having a 0.1 μm thick, semi-insulating thin film of GaN joined. The thin GaN film-joined substrate of the present example is preferably used as substrates for a high frequency device, a high electron mobility transistor (HEMT), and a similar electronic device.

(1) Producing and Polishing GaN Bulk Crystalline Body

A free standing, semi-insulating GaN bulk crystalline body 10 having a diameter of two inches (50.8 mm) and a thickness of 10 mm (dislocation density: at least $1 \times 10^5$ cm$^{-2}$ and at most $1 \times 10^9$ cm$^{-2}$, specific resistance: $1 \times 10^7$ Ωcm) was obtained, similarly as described in example 9, except that when the GaN bulk crystalline body was grown it was doped with Fe, Cr or V by $4 \times 10^{18}$ cm$^{-3}$.

(2) Implanting Hydrogen Ions into GaN Bulk Crystalline Body

Then a method and condition similar to that of example 9 was applied to implant hydrogen ions into the GaN bulk crystalline body at a position corresponding to a plane located at depth T of 0.1 μm from that surface of the GaN bulk crystalline body which was to be joined (i.e., a surface approximated by an N surface).

(3) Joining Substrate Different in Type to GaN Bulk Crystalline Body

Then a method and condition similar to that of example 9 was applied to etch that surface of the GaN bulk crystalline body which was to be joined (i.e., the surface approximated by the N surface) with Cl$_2$ gas to be a clean surface. The substrate different in type to be joined to the GaN bulk crystalline body was implemented by a sapphire substrate, an AlN substrate, a SiC substrate, a ZnSe substrate, a Si substrate, a MgO substrate, a ZnO substrate, a ZnS substrate, a quartz substrate, a carbon substrate, a diamond substrate, a Ga$_2$O$_3$ substrate and a ZrB$_2$ substrate, and the substrates had their respective surfaces to be joined etched with Ar gas to be clean surfaces, respectively, in a method and condition similar to that of example 9. That surface of the GaN bulk crystalline body which was to be joined had maximum surface roughness Rmax of 7 μm, average surface roughness Ra of 0.7 nm, and an off-angle of 0.4° with respect to a (0001) plane. Then, similarly as described in example 9, the GaN bulk crystalline body and each of the above, various substrates different in type were joined together.

(4) Dividing GaN Bulk Crystalline Body

Then, similarly as described in example 9, the GaN bulk crystalline bodies with the aforementioned various substrates different in type joined thereto were subjected to a heat treatment at 400° C. to embrittle a hydrogen ion-implanted plane (a plane to which hydrogen ions were implanted at item (2)) to divide the GaN bulk crystalline body at that plane. Thus there were obtained thin GaN film-joined substrates including the aforementioned various substrates different in type and a semi-insulating thin film of GaN joined on the substrates different in type and having a thickness of 0.1 μm. The GaN bulk crystalline body having had the thin film of GaN divided therefrom is used to produce a subsequent thin GaN film-joined substrate.

The above process can be repeated to obtain from a 10 mm thick GaN bulk crystalline body 10,000 thin GaN film joined substrates including a thin film of GaN of 0.1 μm thick. A 10 mm thick GaN bulk crystalline body cut with a wire saw, as conventional, can only yield 10 GaN substrates of 300 μm thick. In the present example a large number of thin GaN film-joined substrates can be obtained from a GaN bulk crystalline body and hence produced at a significantly reduced cost.

In the thin GaN film-joined substrate of the present example, as has been described in example 11, the substrate different in type that has a coefficient of thermal expansion of at least $1 \times 10^{-8}$ K$^{-1}$ and at most $1 \times 10^{-5}$ K$^{-1}$, a heat resistance to at least 1,200° C., anti-corrosiveness, and other similar characteristics is suitably used.

Furthermore the thin GaN film joined substrate of the present example is used as a substrate for a HEMT or a similar electronic device. Accordingly, to reduce or prevent the device's leak current, the substrate different in type that is implemented by a semi-insulating or insulating substrate, such as a sapphire substrate, an AlN substrate, a SiC substrate, a ZnSe substrate, a Si substrate, a MgO substrate, a ZnO substrate, a ZnS substrate, a quartz substrate, a diamond substrate, a Ga$_2$O$_3$ substrate and a ZrB$_2$ substrate, and the like, is preferably used.

Example 13

The present example provides still another specific example of the thin GaN film joined substrate of embodiment 1 and embodiment 1A by a thin GaN film-joined substrate having joined thereto a 0.1 μm thick, semi-insulating thin film of GaN including a first crystalline region of a single crystal and a second crystalline region of a polycrystal. The thin GaN film-joined substrate of the present example is preferably used as substrates for a HEMT and a similar electronic device.

(1) Producing and Polishing GaN Bulk Crystalline Body

A 10 mm thick, free standing, semi-insulating GaN bulk crystalline body 10 (dislocation density: at least $1\times10^4$ cm$^{-2}$ and at most $1\times10^8$ cm$^{-2}$, specific resistance: $1\times10^7$ Ωcm) including a first crystalline region of a single crystal and a second crystalline region of a polycrystal was obtained, similarly as described in example 11, except that when the GaN bulk crystalline body was grown it was doped with Fe, Cr or V by $5\times10^{18}$ cm$^{-3}$ and that a source gas of nitrogen was increased in partial pressure (to at least 23 kPa, more specifically). Accordingly, with reference to FIG. 6C, GaN bulk crystalline body 10 has N surface 10$n$ including N surface 11$n$ of first crystalline region 11 and polycrystalline surface 12$p$ of second crystalline region 12, and Ga surface 10$g$ including Ga surface 11$g$ of the first crystalline region and a polycrystalline surface 12$q$ of the second crystalline region. Then, similarly as described in example 11, GaN bulk crystalline body 10 had a surface to be joined (i.e., that surface approximated by N surface 10$n$) polished and thus mirror finished.

(2) Implanting Hydrogen Ions into GaN Bulk Crystalline Body

Then a method and condition similar to that of example 11 was applied to implant hydrogen ions into the GaN bulk crystalline body at a position corresponding to a plane located at a depth of 0.1 μm from the N surface of the GaN bulk crystalline body (i.e., the N surface of the first crystalline region and the Ga surface of the second crystalline region).

(3) Joining Substrate Different in Type to GaN Bulk Crystalline Body

Then a method and condition similar to that of example 11 was applied to etch that surface of the GaN bulk crystalline body which was to be joined (i.e., the surface approximated by N surface 10$n$ (i.e., N surface 11$n$ of first crystalline region 11 and polycrystalline surface 12$p$ of second crystalline region 12)) with Cl$_2$ gas to be a clean surface. With reference to FIG. 7(c), note that if second crystalline region 12 is formed of a polycrystal having an average grain size of approximately at least 5 μm, N surface 11$n$ of first crystalline region 11 is etched faster than polycrystalline surface 12$p$ of second crystalline region 12. Accordingly at that surface of GaN bulk crystalline body 10 which is to be joined (i.e., the surface approximated by N surface 10$n$) there results a recess and protrusion (or gap 10$v$) of approximately a few tens nm as shown in FIG. 7(c). That surface of the GaN bulk crystalline body which was to be joined, excluding the gap, had a maximum surface roughness Rmax of 7 μm, an average surface roughness Ra of 0.7 nm and an off-angle of 0.4° with respect to a (0001) plane.

Furthermore, a method and condition similar to that of example 11 was applied to etch a substrate different in type to be joined to the GaN bulk crystalline body. The substrate was implemented by a sapphire substrate, an AlN substrate, a SiC substrate, a ZnSe substrate, a Si substrate, a MgO substrate, a ZnO substrate, a ZnS substrate, a quartz substrate, a carbon substrate, a diamond substrate, a Ga$_2$O$_3$ substrate, and a ZrB$_2$ substrate, and the substrates had their respective surfaces to be joined etched with Ar gas to be clean surfaces.

Then, similarly as described in example 11, the GaN bulk crystalline body and each of the above various substrates different in type were joined together. With reference to FIG. 7(d), as GaN bulk crystalline body 10 had N surface 10$n$ with a protrusion and recess of approximately a few tens nm, gap 10$v$ regularly resulted between GaN bulk crystalline body 10 and substrate 20 different in type. Such gap effectively alleviates a stress derived from a difference in coefficient of thermal expansion between a thin film of GaN and the substrate different in type, that is caused in growing a GaN-based semiconductor layer on the thin film of GaN.

Note that if second crystalline region 12 is formed of a polycrystal having an average grain size of approximately less than 5 μm, N surface 11$n$ of first crystalline region 11 is etched more slowly than polycrystalline surface 12$p$ of second crystalline region 12. Accordingly, in contrast to FIG. 7(c), at that surface of the GaN bulk crystalline body which was to be joined (i.e., that surface of GaN bulk crystalline body 10 which is approximated by N surface 10$n$) there results a recess and protrusion (or gap) of approximately a few tens nm such that polycrystalline surface 12$p$ of second crystalline region 12 is recessed relative to surface 11$n$ of first crystalline region 11.

(4) Dividing GaN Bulk Crystalline Body

Then, similarly as described in example 11, GaN bulk crystalline bodies with the aforementioned various substrates different in type joined thereto were subjected to a heat treatment at 400° C. to embrittle a hydrogen ion-implanted plane (a plane to which hydrogen ions were implanted at item (2)) to divide the GaN bulk crystalline body at that plane. Thus there were obtained thin GaN film-joined substrates including the aforementioned various substrates different in type and a thin film of GaN joined on the substrates different in type and having a thickness of 0.1 μm. The GaN bulk crystalline body having had the thin film of GaN divided therefrom is used to produce a subsequent thin GaN film-joined substrate.

The above process can be repeated to obtain from a 10 mm thick GaN bulk crystalline body 6,000 thin GaN film-joined substrates including a thin film of GaN of 0.1 μm thick. A 10 mm thick GaN bulk crystalline body cut with a wire saw, as conventional, can only yield 10 GaN substrates of 300 μm thick. In the present example a large number of thin GaN film-joined substrates can be obtained from a GaN bulk crystalline body and hence produced at a significantly reduced cost.

In the thin GaN film-joined substrate of the present example, as has been described in example 12, the substrate different in type that has a coefficient of thermal expansion of at least $1\times10^{-8}$ K$^{-1}$ and at most $1\times10^{-5}$ K$^{-1}$, and a heat resistance to at least 1,200° C., and is anti-corrosive, and semi-insulating or insulating, and the like, is suitably used.

Example 14

The present example provides still another specific example of the thin GaN film-joined substrate of embodiment 1 and embodiment 1A by a thin GaN film-joined substrate having joined thereto a 0.1 μm thick, electrically conductive thin film of GaN including a first crystalline region of a single crystal and a second crystalline region formed of a single crystal having a [0001] direction inverted relative to the first crystalline region. The thin GaN film-joined substrate of the present example is preferably used as substrates for a vertical transistor and a similar electronic device.

(1) Producing and Polishing GaN Bulk Crystalline Body

Similarly as described in example 11, a free standing, electrically conductive GaN bulk crystalline body having a diameter of two inches (50.8 mm) and a thickness of 10 mm and including a first crystalline region of a single crystal and a second crystalline region formed of a single crystal having a [0001] direction inverted relative to the first crystalline region was obtained, having a dislocation density of at least $1\times10^4$ cm$^{-2}$ and at most $1\times10^8$ cm$^{-2}$, a carrier density of $4\times10^{18}$ cm$^{-3}$, and a specific resistance of 0.01 Ωcm. Then, similarly as described in example 3, the GaN bulk crystalline body had an N surface polished and thus mirror finished.

(2) Implanting Hydrogen Ions into GaN Bulk Crystalline Body

Then a method and condition similar to that of example 11 was applied to implant hydrogen ions into the GaN bulk crystalline body at a position corresponding to a plane located at a depth of 0.1 μm from that surface of the GaN bulk crystalline body which was to be joined (i.e., that surface approximated by the N surface (i.e., the N surface of the first crystalline region and the Ga surface of the second crystalline region)).

(3) Joining Substrate Different in Type to GaN Bulk Crystalline Body

Then a method and condition similar to that of example 11 was applied to etch that surface of the GaN bulk crystalline body which was to be joined (i.e., the surface approximated by the N surface (i.e., the N surface of the first crystalline region and the Ga surface of the second crystalline region)) with $Cl_2$ gas to be a clean surface. With reference to FIG. 7(c), note that N surface 11n of first crystalline region 11 is etched faster than Ga surface 12g of second crystalline region 12. Accordingly at N surface 10n of GaN bulk crystalline body 10 there results a recess and protrusion of approximately a few tens nm as shown in FIG. 7(c). Furthermore, a method and condition similar to that of example 11 was applied to etch a substrate different in type to be joined to the GaN bulk crystalline body. The substrate was implemented by a sapphire substrate, an AlN substrate, a SiC substrate, a ZnSe substrate, a Si substrate, a MgO substrate, a ZnO substrate, a ZnS substrate, a quartz substrate, a carbon substrate, a diamond substrate, a $Ga_2O_3$ substrate, and a $ZrB_2$ substrate, and the substrates had their respective surfaces to be joined etched with Ar gas to be clean surfaces. That surface of the GaN bulk crystalline body which was to be joined had a maximum surface roughness Rmax of 7 μm, an average surface roughness Ra of 0.7 nm and an off-angle of 0.4° with respect to a (0001) plane.

Then, similarly as described in example 11, the GaN bulk crystalline body and each of the above various substrates different in type were joined together. With reference to FIG. 7(d), as the GaN bulk crystalline body had the surface to be joined (i.e., the surface approximated by the N surface) that has a protrusion and recess of approximately a few tens nm, a gap regularly resulted between the GaN bulk crystalline body and the substrate different in type. Such gap effectively alleviates a stress derived from a difference in coefficient of thermal expansion between a thin film of GaN and the substrate different in type, that is caused in growing a GaN-based semiconductor layer on the thin film of GaN.

(4) Dividing GaN Bulk Crystalline Body

Then, similarly as described in example 11, the GaN bulk crystalline bodies with the aforementioned various substrates different in type joined thereto were subjected to a heat treatment at 400° C. to embrittle a hydrogen ion-implanted plane (a plane to which hydrogen ions were implanted at item (2)) to divide the GaN bulk crystalline body at that plane. Thus there were obtained thin GaN film-joined substrates including the aforementioned various substrates different in type and a thin film of GaN joined on the substrates different in type and having a thickness of 0.1 μm. The GaN bulk crystalline body having had the thin film of GaN divided therefrom is used to produce a subsequent thin GaN film-joined substrate.

The above process can be repeated to obtain from a 10 mm thick GaN bulk crystalline body 6,000 thin GaN film-joined substrates including a thin film of GaN of 0.1 μm thick. A 10 mm thick GaN bulk crystalline body cut with a wire saw, as conventional, can only yield 10 GaN substrates of 300 μm thick. In the present example a large number of thin GaN film-joined substrates can be obtained from a GaN bulk crystalline body and hence produced at a significantly reduced cost.

In the thin GaN film-joined substrate of the present example, as has been described in example 9, the substrate different in type that has a coefficient of thermal expansion of at least $1 \times 10^{-8}$ $K^{-1}$ and at most $1 \times 10^{-5}$ $K^{-1}$, and a heat resistance to at least 1,200° C., anti-corrosiveness, and the like characteristics, is suitably used.

Furthermore the thin GaN film-joined substrate of the present example is used as a substrate for a vertical transistors or a similar electronic device. Accordingly, to allow vertical transistor structure, the substrate different in type that is implemented by an electrically conductive substrate, such as a SiC substrate, a Si substrate, a carbon substrate, and the like, is preferably used.

Example 15

Figure 8:
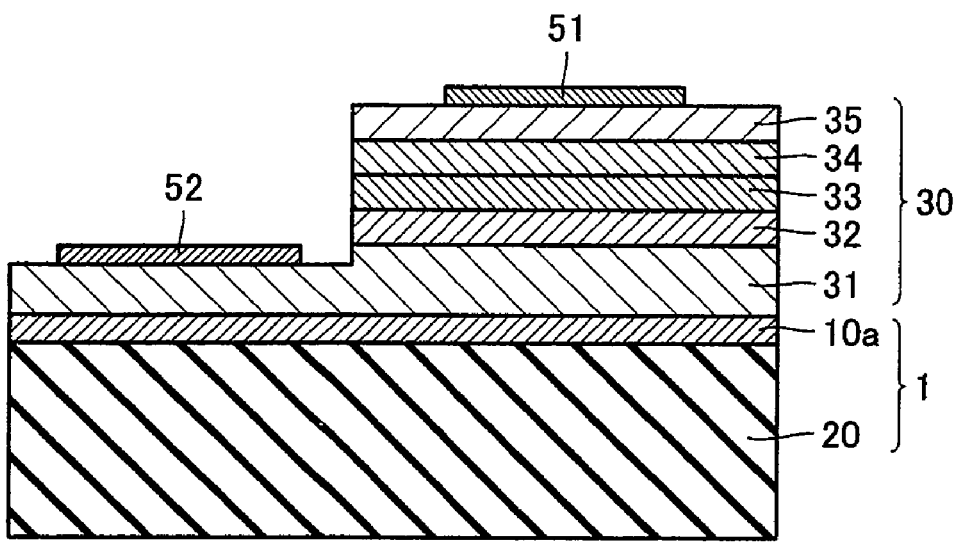
FIGS. 8 and 9 are schematic cross sections of one and another examples of the first GaN-based semiconductor device in accordance with the present invention that are implemented by LEDs, respectively.

With reference to FIG. 8 the present example provides a specific example of the first GaN-based semiconductor device of embodiment 2 implemented by an LED having electrodes on one main surface. In the present example the LED includes a substrate implemented by that produced in example 11, i.e., thin GaN film-joined substrate 1 including an insulating sapphire substrate (substrate 20 different in type) and thin film of GaN 10a of 0.1 μm thick joined on the sapphire substrate and including a first crystalline region of a single crystal and a second crystalline region formed of a single crystal having a [0001] direction inverted relative to the first crystalline region.

(1) Fabricating LED

With reference to FIG. 8, the LED of the present example was fabricated in the following method: More specifically, thin GaN film-joined substrate 1, which includes a sapphire substrate (substrate 20 different in type) and thin film of GaN 10a joined on the sapphire substrate, had GaN-based semiconductor layer 30 grown on thin film of GaN 10a by MOCVD. More specifically, a 5 μm thick n type GaN layer 31, a 0.5 μm thick n type $Al_{0.05}Ga_{0.95}N$ layer 32 overlying layer 31, a 100 nm thick light emitting layer 33 overlying layer 32 and having a multi quantum well (MQW) structure formed of 6 pairs of an $In_{0.15}Ga_{0.85}N$ layer and an $In_{0.01}Ga_{0.99}N$ layer, a 20 nm thick p type $Al_{0.20}G_{0.80}N$ layer 34 overlying layer 33, and a 0.15 μm thick p type GaN layer 35 overlying layer 34 were grown. The present thin GaN film-joined substrate produced in example 11 had a gap between the substrate different in type and the thin film of GaN. This effectively alleviated a stress derived from a difference in coefficient of thermal expansion between the substrate different in type and the thin film of GaN that is caused in epitaxially growing the GaN-based semiconductor layer, and there was no crack observed in any of the substrate different in type, the thin film of GaN and the GaN-based semiconductor layer.

Subsequently, mesa etching was performed to expose a partial surface of n type GaN layer 31. Subsequently, vacuum deposition or electron beam deposition was employed to deposit p- and n-side electrodes 51 and 52 on p type GaN layer 35 and n type GaN layer 31 having the partially exposed surface, respectively.

As a comparative example R15, an LED was fabricated in a method and condition similar to that of example 15, except that GaN-based semiconductor layer 30 was grown directly on the sapphire substrate (substrate 20 different in type).

Furthermore as an example 15A an LED was fabricated in a method and condition similar to that of example 15, except that when GaN-based semiconductor layer 30 was grown, light emitting layer 33 having a MQW structure formed of 6 pairs of an $Al_{0.05}Ga_{0.95}N$ layer and a GaN layer was provided. As a comparative example R15A an LED was fabricated in a method and condition similar to that of example 15A, except that GaN-based semiconductor layer 30 was grown directly on the sapphire substrate (substrate 20 different in type).

(2) Evaluating LED in Characteristics

The emission intensity of the emission spectrum of the LED of each of example 15 and comparative example R15 was measured at a peak wavelength of 450 nm by electroluminescence. The LED of example 15 provided an emission intensity of 1.2 relative to that of comparative example R15. Furthermore, the emission intensity of the emission spectrum of the LED of each of example 15A and comparative example R15A was measured at a peak wavelength of 350 nm by electroluminescence. The LED of example 15A provided an emission intensity of 10 relative to that of comparative example R15A. It can be seen therefrom that employing the thin GaN film-joined substrate allowed an LED providing large emission intensity and hence an enhanced characteristic to be fabricated at low cost.

Example 16

Figure 9:
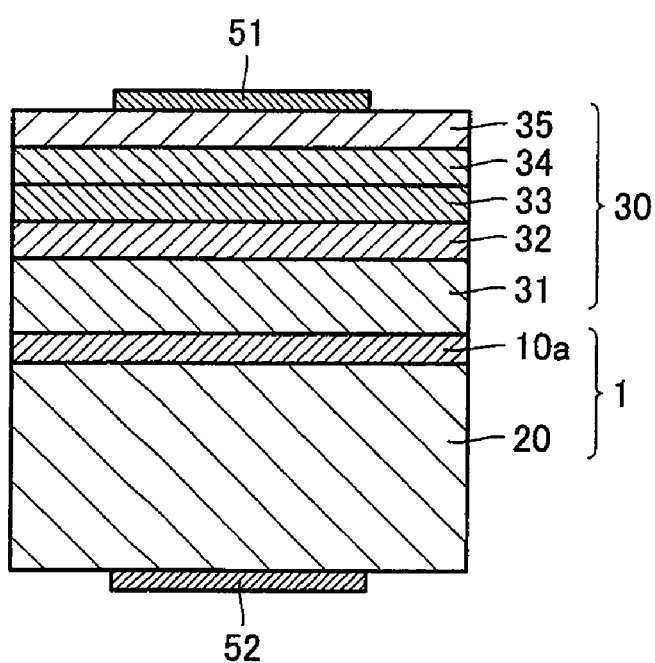

With reference to FIG. 9 the present example provides a still another example of the first GaN-based semiconductor device of embodiment 2 that is implemented by an LED having electrodes on opposite sides, respectively. In the present example the LED includes a substrate implemented by that produced in example 11, i.e., thin GaN film-joined substrate 1 including an electrically conductive Si substrate (substrate 20 different in type) and a 0.1 µm thick, electrically conductive thin film of GaN 10a joined on the Si substrate and including a first crystalline region of a single crystal and a second crystalline region formed of a single crystal having a [0001] direction inverted relative to the first crystalline region.

(1) Fabricating LED

With reference to FIG. 9 the LED of the present example was fabricated in the following method. More specifically, thin GaN film-joined substrate 1, which includes a Si substrate (substrate 20 different in type) and thin film of GaN 10a joined on the Si substrate, had GaN-based semiconductor layer 30 grown on thin film of GaN 10a by MOCVD. More specifically, a 2 µm thick n type GaN layer 31, a 0.5 µm thick n type $Al_{0.05}Ga_{0.95}N$ layer 32 overlying layer 31, a 100 nm thick light emitting layer 33 overlying layer 32 and having a MQW structure formed of 6 pairs of an $In_{0.15}Ga_{0.85}N$ layer and an $Al_{0.01}Ga_{0.99}N$ layer, a 20 nm thick p type $Al_{0.20}Ga_{0.80}N$ layer 34 overlying layer 33, and a 0.15 µm thick p type GaN layer 35 overlying layer 34 were grown. The present thin GaN film-joined substrate produced in example 11 had a gap between the substrate different in type and the thin film of GaN. This effectively alleviated a stress derived from a difference in coefficient of thermal expansion between the substrate different in type and the thin film of GaN that is caused in epitaxially growing the GaN-based semiconductor layer, and there was no crack observed in any of the substrate different in type, the thin film of GaN and the GaN-based semiconductor layer.

Subsequently, vacuum deposition or electron beam deposition was employed to deposit p- and n-side electrodes 51 and 52 on p type GaN layer 35 and the Si substrate (substrate 20 different in type), respectively.

The LED of the present example, having electrodes on opposite main surfaces, respectively, allowed electrical conduction between the main surfaces and thus contributed to a reduced chip size.

Example 17

Figure 10:
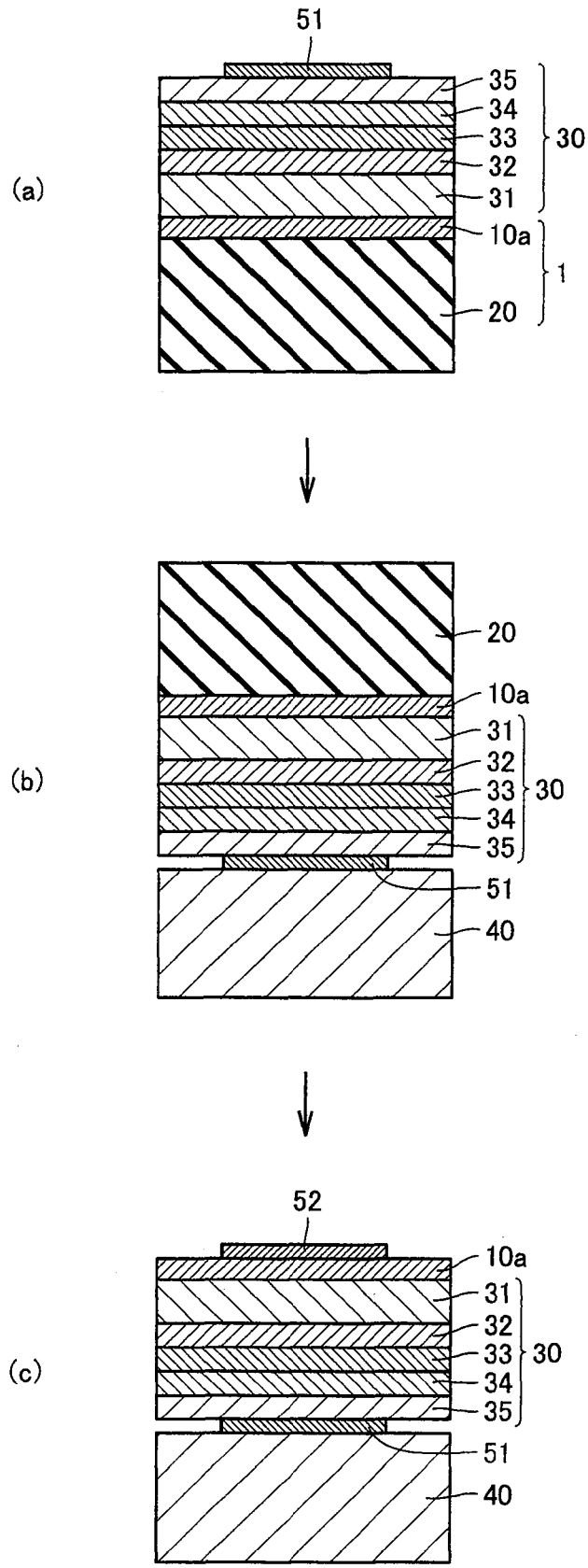
FIGS. 10(a)-10(c) are schematic cross sections for illustrating a process for fabricating one example of the second GaN-based semiconductor device in accordance with the present invention that is implemented by an LED. More specifically.

With reference to FIG. 10 the present example provides a specific example of the second GaN-based semiconductor device of embodiment 3 that is implemented by an LED having electrodes on opposite sides, respectively. The LED in the present example has a structure including a 0.1 µm thick, electrically conductive thin film of GaN 10a, and at least one GaN-based semiconductor layer 30 deposited on thin film of GaN 10a, with a radiating and electrically conductive substrate 40 joined adjacent to an outermost layer of GaN-based semiconductor layer 30.

(1) Fabricating LED

With reference to FIG. 10, the LED of the present example was fabricated in the following method: More specifically, initially, with reference to FIG. 10(a), thin GaN film-joined substrate 1 produced in example 11, which includes an insulating sapphire substrate (substrate 20 different in type) and thin film of GaN 10a of 0.1 µm thick joined on the sapphire substrate, had GaN-based semiconductor layer 30 grown on thin film of GaN 10a by MOCVD. More specifically, a 2 µm thick n type GaN layer 31, a 0.5 µm thick n type $Al_{0.05}Ga_{0.95}N$ layer 32 overlying layer 31, a 100 nm thick light emitting layer 33 overlying layer 32 and having a MQW structure formed of 6 pairs of an $In_{0.15}Ga_{0.85}N$ layer and an $Al_{0.01}Ga_{0.99}N$ layer, a 20 nm thick p type $Al_{0.20}Ga_{0.80}N$ layer 34 overlying layer 33, and a 0.15 µm thick p type GaN layer 35 overlying layer 34 were grown. The present thin GaN film-joined substrate produced in example 11 had a gap between the substrate different in type and the thin film of GaN. This effectively alleviated a stress derived from a difference in coefficient of thermal expansion between the substrate different in type and the thin film of GaN that is caused in epitaxially growing the GaN-based semiconductor layer, and there was no crack observed in any of the substrate different in type, the thin film of GaN and the GaN-based semiconductor layer. Vacuum deposition was then employed to deposit p-side electrode 51 on p type GaN layer 35.

Then with reference to FIG. 10(b) radiating and electrically conductive plate 40 implemented by a Cu plate was joined adjacent to the outermost layer (p type GaN layer 35) of GaN-based semiconductor layer 30, with p-side electrode 51 posed therebetween, with Au-Su solder.

Then with reference to FIG. 10(c) laser lift-off was employed to separate the sapphire substrate (substrate 20 different in type) from thin film of GaN 10a. Electron beam deposition was then employed to deposit n-side electrode 52 on the thin film of GaN.

As a comparative example R17 an LED was fabricated in a method and condition similar to that applied in example 17, except that GaN-based semiconductor layer 30 was grown directly on the sapphire substrate (substrate 20 different in type).

(2) Evaluating Characteristics of LED

The emission intensity of the emission spectrum of the LED of each of example 17 and comparative example R17 was measured at a peak wavelength of 450 nm. The LED of example 17 provided an emission intensity of 1.2 relative to that of comparative example R17. It can be seen therefrom that employing the thin GaN film-joined substrate allowed an LED providing large emission intensity and hence an enhanced characteristic to be fabricated at low cost. Furthermore, the LED of example 17, having the sapphire substrate (substrate 20 different in type) removed, allowed light to be extracted more efficiently. Furthermore, the LED of example 17, having electrodes on opposite main surfaces, respectively, allowed electrical conduction between the main surfaces and thus contributed to a reduced chip size.

Example 18

Figure 11:
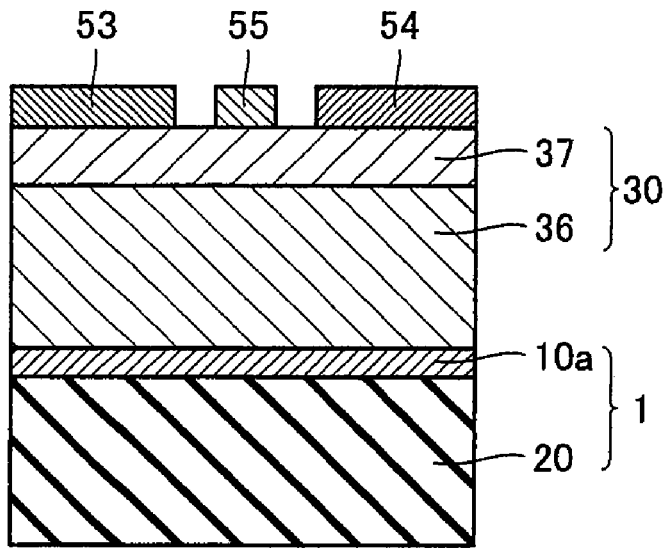
FIG. 11 is a schematic cross section of still another example of the first GaN-based semiconductor device in accordance with the present invention that is implemented by a HEMT.

With reference to FIG. 11 the present example provides a still another specific example of the first GaN-based semiconductor device of embodiment 2 that is implemented by a HEMT. The HEMT in the present example employs a substrate as produced in example 12, i.e., thin GaN film-joined substrate 1 including an insulating sapphire substrate (substrate 20 different in type) and a 0.1 μm thick, semi-insulating thin film of GaN 10a joined on the sapphire substrate.

(1) Fabricating HEMT

With reference to FIG. 11, the HEMT of the present example was fabricated in the following method: More specifically, thin GaN film-joined substrate 1, which includes a sapphire substrate (substrate 20 different in type) and thin film of GaN 10a joined on the sapphire substrate, had GaN-based semiconductor layer 30 grown on thin film of GaN 10a by MOCVD. More specifically, a 3 μm thick, i type GaN layer 36, and a 30 nm thick, i type $Al_{0.25}Ga_{0.75}N$ layer 37 overlying layer 36 were grown. Photolithography and lift off were then employed to provide a source electrode 53 and a drain electrode 54 on i type $Al_{0.25}Ga_{0.75}N$ layer 37. Source and drain electrodes 53 and 54 were both implemented by a 50 nm thick Ti layer, a 100 nm thick Al layer, a 20 nm thick Ti layer, and a 200 nm thick Au layer deposited in layers and subjected to a heat treatment at 800° C. for 30 seconds and thus alloyed. Furthermore a similar technique was employed to provide on i type $Al_{0.25}Ga_{0.75}N$ layer 37 a gate electrode 55 implemented by a 300 nm thick Au layer and having a gate width of 2 μm and a gate length of 150 μm. The HEMT was thus fabricated and its operation was confirmed.

Example 19

Figure 12:
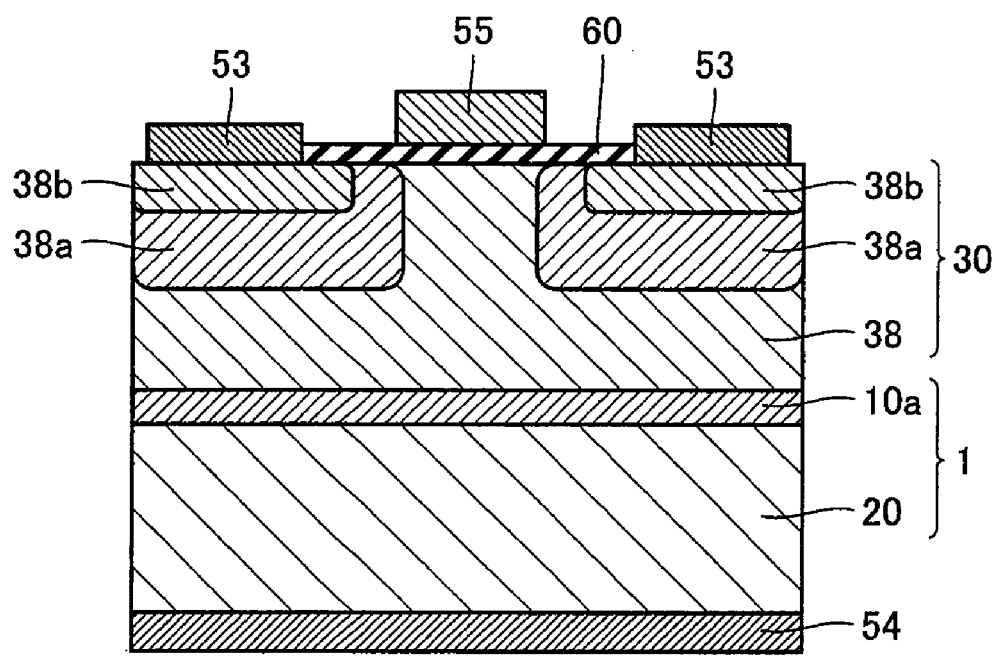
FIG. 12 is a schematic cross section of still another example of the first GaN-based semiconductor device in accordance with the present invention that is implemented by a vertical transistor.

With reference to FIG. 12 the present example provides still another specific example of the first GaN-based semiconductor device of embodiment 2 that is implemented by a vertical transistor. The vertical transistor in the present example employs a substrate as produced in example 14, i.e., thin GaN film-joined substrate 1 including an electrically conductive substrate (substrate 20 different in type) and a 0.1 μm thick, electrically conductive thin film of GaN 10a joined on the electrically conductive substrate and including a first crystalline region of a single crystal and a second crystalline region formed of a single crystal having a [0001] direction inverted relative to the first crystalline region.

(1) Fabricating Vertical Transistor

With reference to FIG. 12, the vertical transistor of the present example was fabricated as follows: thin GaN film-joined substrate 1, which includes an electrically conductive Si substrate (substrate 20 different in type) and thin film of GaN 10a joined on the Si substrate, had GaN-based semiconductor layer 30 implemented by a 10 μm thick, n⁻ type GaN layer 38 (electron density: $1×10^{16}$ cm$^{-3}$) grown on thin film of GaN 10a by MOCVD.

Selective ion implantation was then employed to implant Mg ions into a partial region of n⁻ type GaN layer 38 to provide a p type layer 38a and implant Si ions into a partial region of p type layer 38a to provide an n⁺ type layer 38b. Then on n type GaN layer 38, p type layer 38a and n⁺ type layer 38b a passivation film (not shown) implemented by a 300 nm thick $SiO_2$ layer was deposited and thereafter a heat treatment was performed at 1,250° C. for 30 seconds to activate the implanted ions.

Then the passivation film was removed with hydrofluoric acid and subsequently on n type GaN layer 38, p type layer 38a and n⁺ type layer 38b plasma chemical vapor deposition (p-CVD) was employed to deposit an insulation film 60 implemented by a 50 nm thick $SiO_2$ layer. Photolithography and buffered hydrofluoric acid were then employed to selectively etch a partial region of insulation film 60 and source electrode 53 was provided by lift off. Source electrode 53 was implemented by a 50 nm thick Ti layer, a 100 nm thick Al layer, a 20 nm thick Ti layer, and a 200 nm thick Au layer deposited in layers and subjected to a heat treatment at 800° C. for 30 seconds and thus alloyed. Photolithography and lift off were then employed to provide on insulation film 60 gate electrode 55 implemented by a 300 nm thick Al layer to configure a metal-insulator-semiconductor (MIS) structure. Then on the Si substrate (substrate 20 different in type) drain electrode 54 was provided. Drain electrode 54 was implemented by a 50 nm thick Ti layer, a 100 nm thick Al layer, a 20 nm thick Ti layer, and a 200 nm thick Au layer deposited in layers and subjected to a heat treatment at 800° C. for 30 seconds and thus alloyed. The vertical transistor was thus fabricated and its operation was confirmed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a thin GaN film-joined substrate, the method comprising the steps of:
   joining on a GaN bulk crystalline body a substrate different in type, different in chemical composition from GaN; and
   dividing said GaN bulk crystalline body at a plane having a distance of at least 0.1 μm and at most 100 μm from an interface thereof with said substrate different in type, to provide a thin film of GaN on said substrate different in type,
   wherein said GaN bulk crystalline body had a surface joined to said substrate different in type, that has a maximum surface roughness Rmax of at most 20 μm, and
   an off-angle formed by said surface of said GaN bulk crystalline body to be joined and a (0001) plane of said GaN bulk crystalline body is at least 0.03° and at most 20°.

2. The method of producing said thin GaN film-joined substrate according to claim 1, further comprising the step of implanting a type of ions selected from the group consisting of hydrogen ions, helium ions and nitrogen ions into said GaN bulk crystalline body at said plane located at a depth of at least 0.1 μm and at most 100 μm from said surface of said GaN bulk crystalline body that is to be joined, before the step of joining said substrate different in type on said GaN bulk crystalline body, wherein the step of dividing said GaN bulk crystalline body includes subjecting said GaN bulk crystalline body to a heat treatment.

3. The method of producing said thin GaN film-joined substrate according to claim 1, wherein the step of dividing said GaN bulk crystalline body includes cutting said GaN bulk crystalline body at said plane having said distance of at least 0.1 μm and at most 100 μm from said interface thereof with said substrate different in type.

4. A method of fabricating a first GaN-based semiconductor device with a thin GaN film-joined substrate obtained in the method of claim 1, comprising the step of growing at least one GaN-based semiconductor layer on the thin film of GaN of the thin GaN film-joined substrate.

5. A method of fabricating a second GaN-based semiconductor device utilizing the first GaN-based semiconductor device obtained in the method of claim 4, comprising the steps of: joining a radiating and electrically conductive substrate on an outermost layer of the GaN-based semiconductor layer of said first GaN-based semiconductor device; and separating the thin film of GaN and the substrate different in type from each other.

* * * * *